(12) United States Patent
Seo et al.

(10) Patent No.: US 9,172,044 B2
(45) Date of Patent: Oct. 27, 2015

(54) ORGANIC LIGHT-EMITTING DEVICE AND METHOD OF MANUFACTURING THE SAME

(71) Applicant: Samsung Display Co., Ltd., Yongin, Gyeonggi-do (KR)

(72) Inventors: Ji-Hoon Seo, Yongin (KR); Kwan-Hee Lee, Yongin (KR); Byung-Hoon Chun, Yongin (KR); Ja-Hyun Im, Yongin (KR); Sung-Jun Bae, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 204 days.

(21) Appl. No.: 13/795,867

(22) Filed: Mar. 12, 2013

(65) Prior Publication Data

US 2014/0103302 A1  Apr. 17, 2014

(30) Foreign Application Priority Data

Oct. 12, 2012 (KR) .......................... 10-2012-0113828

(51) Int. Cl.
*H01L 51/50* (2006.01)
*H01L 51/00* (2006.01)

(52) U.S. Cl.
CPC ............ *H01L 51/005* (2013.01); *H01L 51/006* (2013.01); *H01L 51/0061* (2013.01); *H01L 51/5084* (2013.01); *H01L 51/0058* (2013.01); *H01L 51/0072* (2013.01); *H01L 51/5072* (2013.01); *H01L 51/5076* (2013.01); *H01L 2251/308* (2013.01)

(58) Field of Classification Search
None
See application file for complete search history.

(56) References Cited

U.S. PATENT DOCUMENTS

| 2004/0245542 | A1 | 12/2004 | Kim |
| 2005/0221124 | A1* | 10/2005 | Hwang et al. ................. 428/690 |
| 2013/0032788 | A1* | 2/2013 | Lee et al. ........................ 257/40 |

FOREIGN PATENT DOCUMENTS

| JP | 2004-079413 | 3/2004 |
| KR | 2003-0039100 A | 5/2003 |
| KR | 10-2005-0097670 | 10/2005 |
| WO | WO 2012/011756 | * 1/2012 |

* cited by examiner

*Primary Examiner* — Gregory Clark
(74) *Attorney, Agent, or Firm* — Knobbe Martens Olson & Bear LLP

(57) ABSTRACT

An organic light-emitting device with an electron transport layer disposed between the organic emission layer and the second electrode and comprising an anthracene-based compound and a carbazole-based compound represented by Formula 1 below:

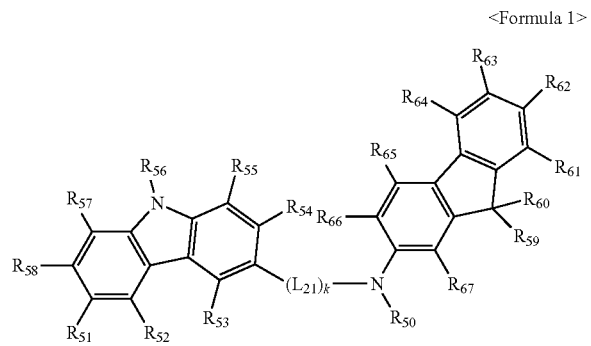

with improved efficiency and lifetime and a method for preparing the same are provided.

20 Claims, 1 Drawing Sheet

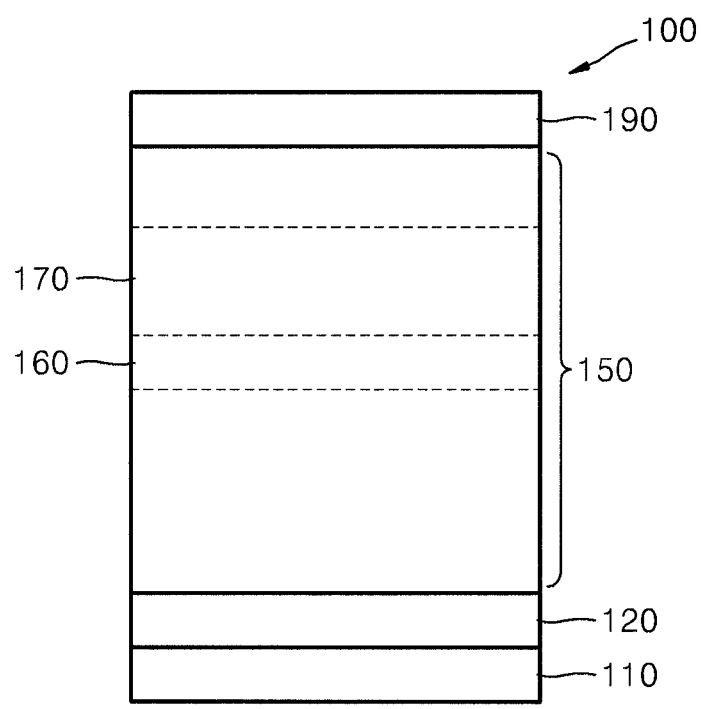

ORGANIC LIGHT-EMITTING DEVICE AND METHOD OF MANUFACTURING THE SAME

CROSS-REFERENCE TO RELATED APPLICATIONS

This application claims the benefit of Korean Patent Application No. 10-2012-0113828, filed on Oct. 12, 2012, in the Korean Intellectual Property Office, the disclosure of which is incorporated herein by reference.

BACKGROUND

1. Field

One or more embodiments relate to an organic light-emitting device and a method of manufacturing the same.

2. Description of the Related Technology

Organic light-emitting devices (OLEDs), which are self-emitting devices, have advantages such as wide viewing angles, excellent contrast, quick response, high brightness, excellent driving voltage characteristics, and can provide multicolored images. Due to these characteristics OLEDs have been receiving growing attention.

A typical OLED has a structure including a substrate, and an anode, a hole transport layer (HTL), an organic emission layer (EML), an electron transport layer (ETL), and a cathode which are sequentially stacked on the substrate. The HTL, the organic EML, and the ETL are organic thin films comprising organic compounds. When a voltage is applied between the anode and the cathode, holes injected from the anode move to the organic EML via the HTL, and electrons injected from the cathode move to the organic EML via the ETL. The holes and electrons (carriers) recombine in the organic EML to generate excitons. When the excitons drop from an excited state to a ground state, light is emitted.

SUMMARY

One or more embodiments include an organic light-emitting device including an electron transport layer with improved electron mobility that is not likely to oxidize, and a method of manufacturing the organic light-emitting device.

One or more embodiments include an organic light-emitting display apparatus including the organic light-emitting device.

Additional aspects will be set forth in part in the description which follows and, in part, will be apparent from the description, or may be learned by practice of the presented embodiments.

According to one or more embodiments, an organic light-emitting device includes: a substrate; a first electrode; a second electrode disposed opposite to the first electrode; an organic emission layer disposed between the first electrode and the second electrode; and an electron transport layer disposed between the organic emission layer and the second electrode and comprising an anthracene-based compound and a carbazole-based compound represented by Formula 1 below:

<Formula 1>

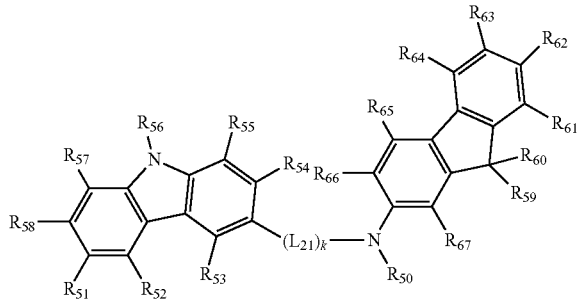

wherein, in Formula 1 above, $R_{50}$ is one of a substituted or unsubstituted phenyl group, a substituted or unsubstituted naphthyl group, a substituted or unsubstituted anthryl group, a substituted or unsubstituted biphenyl group, and a substituted or unsubstituted pyridinyl group;

$L_{21}$ is one of a substituted or unsubstituted $C_1$-$C_{30}$ alkylene group, a substituted or unsubstituted $C_2$-$C_{30}$ alkenylene group, a substituted or unsubstituted $C_6$-$C_{30}$ arylene group, and a substituted or unsubstituted $C_2$-$C_{30}$ hetero arylene group;

$R_{51}$ to $R_{67}$ are each independently one of a hydrogen atom, a deuterium atom, halogen, hydroxyl group, cyano group, nitro group, carboxyl group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_1$-$C_{30}$ alkylthio group, a substituted or unsubstituted $C_3$-$C_{10}$ cycloalkyl group, a substituted or unsubstituted $C_3$-$C_{10}$ cycloalkenyl group, a substituted or unsubstituted $C_6$-$C_{30}$ aryl group, a substituted or unsubstituted $C_6$-$C_{30}$ aryloxy group, a substituted or unsubstituted $C_6$-$C_{30}$ arylthio group, a substituted or unsubstituted $C_2$-$C_{30}$ heteroaryl group, and —$N(Q_{11})(Q_{12})$, where $Q_{11}$ and $Q_{12}$ are each independently one of a hydrogen atom, a deuterium atom, a halogen, a hydroxyl group, a cyano group, a amino group, a nitro group, a carboxyl group, a $C_1$-$C_{30}$ alkyl group, a $C_2$-$C_{30}$ alkenyl group, a $C_2$-$C_{30}$ alkynyl group, a $C_1$-$C_{30}$ alkoxy group, a $C_1$-$C_{30}$ alkylthio group, a $C_3$-$C_{10}$ cycloalkyl group, a $C_3$-$C_{10}$ cycloalkenyl group, a $C_6$-$C_{30}$ aryl group, a $C_6$-$C_{30}$ aryloxy group, a $C_6$-$C_{30}$ arylthio group, and a $C_2$-$C_{30}$ heteroaryl group; and k is an integer from 0 to 3.

The electron transport layer may further include an electron-migration retarding material, in addition to the anthracene-based compound and the carbazole-based compound.

According to one or more embodiments, a method of manufacturing an organic light-emitting device includes: forming a first electrode on a substrate; forming an organic emission layer on the first electrode; forming an electron transport layer on the organic emission layer, the electron transport layer including an anthracene-based compound and a carbazole-based compound represented by Formula 1 below; and forming a second electrode on the electron transport layer

BRIEF DESCRIPTION OF THE DRAWING

These and/or other aspects will become apparent and more readily appreciated from the following description of the embodiments, taken in conjunction with the accompanying drawing of which:

FIG. 1 is a schematic cross-sectional view of a structure of an organic light-emitting device according to an embodiment.

DETAILED DESCRIPTION

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list. In the drawings, the sizes or thicknesses of layers and regions are exaggerated for clarify, and thus are not limited thereto.

FIG. 1 is a schematic cross-sectional view of a structure of an organic light-emitting device according to an embodiment.

Referring to FIG. 1, the organic light-emitting device 100 includes a substrate 110, a first electrode 120, a second electrode 190 disposed opposite to the first electrode 12, and an organic layer 150 disposed between the first electrode 120 and the second electrode 190. The organic layer 150 includes an organic emission layer 160 in which light is generated from recombination of holes and electrons, and an electron transport layer 170 disposed between the organic emission layer 160 and the second electrode 190 and including an anthracene-based compound and a carbazole-based compound represented by Formula 1 below:

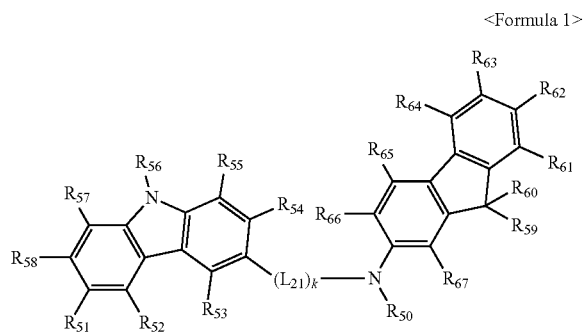

<Formula 1>

In Formula 1 above, $R_{50}$ is one of a substituted or unsubstituted phenyl group, a substituted or unsubstituted naphthyl group, a substituted or unsubstituted anthryl group, a substituted or unsubstituted biphenyl group, and a substituted or unsubstituted pyridinyl group; $L_{21}$ is one of a substituted or unsubstituted $C_1$-$C_{30}$ alkylene group, a substituted or unsubstituted $C_2$-$C_{30}$ alkenylene group, a substituted or unsubstituted $C_6$-$C_{30}$ arylene group, and a substituted or unsubstituted $C_2$-$C_{30}$ hetero arylene group; $R_{51}$ to $R_{67}$ are each independently one of a hydrogen atom, a deuterium atom, a halogen, a hydroxyl group, a cyano group, a nitro group, a carboxyl group, a substituted or unsubstituted $C_1$-$C_{30}$alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_1$-$C_{30}$ alkylthio group, a substituted or unsubstituted $C_3$-$C_{10}$ cycloalkyl group, a substituted or unsubstituted $C_3$-$C_{10}$ cycloalkenyl group, a substituted or unsubstituted $C_6$-$C_{30}$ aryl group, a substituted or unsubstituted $C_6$-$C_{30}$ aryloxy group, a substituted or unsubstituted $C_6$-$C_{30}$ arylthio group, a substituted or unsubstituted $C_2$-$C_{30}$ heteroaryl group, and —N($Q_{11}$)($Q_{12}$), where $Q_{11}$ and $Q_{12}$ are each independently one of a hydrogen atom, a deuterium atom, a halogen, a hydroxyl group, a cyano group, an amino group, a nitro group, a carboxyl group, a $C_1$-$C_{30}$ alkyl group, a $C_2$-$C_{30}$ alkenyl group, a $C_2$-$C_{30}$ alkynyl group, a $C_1$-$C_{30}$ alkoxy group, a $C_1$-$C_{30}$ alkylthio group, a $C_3$-$C_{10}$ cycloalkyl group, a $C_3$-$C_{10}$ cycloalkenyl group, a $C_6$-$C_{30}$ aryl group, a $C_6$-$C_{30}$ aryloxy group, a $C_6$-$C_{30}$ arylthio group, and a $C_2$-$C_{30}$ heteroaryl group; and k is an integer from 0 to 3.

In Formula 1, $R_{50}$ may be one of a phenyl group, a naphthyl group, an anthryl group, a biphenyl group, and a pyridinyl group; and a phenyl group, a naphthyl group, an anthryl group, a biphenyl group, and a pyridinyl group that are substituted with at least one of a deuterium atom, a halogen atom, a cyano group, a hydroxyl group, an amino group, a $C_1$-$C_{20}$ alkyl group, a $C_1$-$C_{20}$ alkoxy group, a phenyl group, a naphthyl group, an anthryl group, and a pyridinyl group, but is not limited thereto.

In Formula 1, $L_{21}$ may be one of a substituted or unsubstituted $C_6$-$C_{14}$ arylene group, and a substituted or unsubstituted $C_2$-$C_{14}$ heteroarylene group. For example, $L_{21}$ may be a substituted or unsubstituted phenylene group, a substituted or unsubstituted naphthylene group, a substituted or unsubstituted anthrylene group, a substituted or unsubstituted phenanthrenyl group, a substituted or unsubstituted pyridinylene group, or a substituted or unsubstituted pyrimidinylene group, but is not limited thereto. In some embodiments, $L_{21}$ may be one of a phenylene group, a naphthylene group, an anthrylene group, a phenanthrenyl group, a pyridinylene group, and a pyrimidinylene group; a phenylene group, a naphthylene group, an anthrylene group, a phenanthrenyl group, a pyridinylene group, and a pyrimidinylene group that are substituted with at least one of a deuterium atom, a halogen atom, a cyano group, a hydroxyl group, an amino group, a $C_1$-$C_{20}$ alkyl group, a $C_1$-$C_{20}$ alkoxy group, a phenyl group, a naphthyl group, an anthryl group, and a pyridinyl group, but is not limited thereto.

In Formula 1 above, $R_{51}$ to $R_{67}$ may be each independently selected from among a hydrogen atom, a deuterium atom, a halogen, a hydroxyl group, a cyano group, a nitro group, a carboxyl group, a substituted or unsubstituted $C_1$-$C_{20}$ alkyl group, a substituted or unsubstituted $C_1$-$C_{20}$ alkoxy group, a substituted or unsubstituted $C_6$-$C_{14}$aryl group, and a substituted or unsubstituted $C_2$-$C_{14}$ heteroaryl group. For example, in Formula 1, $R_{51}$ to $R_{67}$ may be each independently one of a hydrogen atom, a deuterium atom, a halogen, a hydroxyl group, a cyano group, a nitro group, a carboxyl group, a $C_1$-$C_{20}$ alkyl group, a $C_1$-$C_{20}$ alkoxy group, a phenyl group, a naphthyl group, an anthryl group, a biphenyl group, and a pyridinyl group; and a phenyl group, a naphthyl group, an anthryl group, a biphenyl group, and a pyridinyl group that are substituted with at least one of a deuterium atom, a halogen atom, a cyano group, a hydroxyl group, an amino group, a $C_1$-$C_{20}$ alkyl group, a $C_1$-$C_{20}$ alkoxy group, a phenyl group, a naphthyl group, an anthryl group, and a pyridinyl group, but is not limited thereto.

In some embodiments, in Formula 1, $R_{51}$ to $R_{55}$, $R_{57}$, $R_{58}$, and $R_{61}$ to $R_{67}$ may be hydrogen atoms; and $R_{56}$, $R_{60}$ and $R_{59}$ may be each independently one of a $C_1$-$C_{20}$ alkyl group, a $C_1$-$C_{20}$ alkoxy group, a phenyl group, a naphthyl group, an anthryl group, a biphenyl group, and a pyridinyl group; and a phenyl group, a naphthyl group, an anthryl group, a biphenyl group, and a pyridinyl group that are substituted with at least one of a deuterium atom, a halogen atom, a cyano group, a hydroxyl group, an amino group, a $C_1$-$C_{20}$ alkyl group, a $C_1$-$C_{20}$ alkoxy group, a phenyl group, a naphthyl group, an anthryl group, and a pyridinyl group, but is not limited thereto.

In Formula 1, k indicates the number of $L_{21}$s. When k is 0, N and the $3^{rd}$ carbon of carbazole are directly linked to one another. When k is 2 or greater, two or more $L_{21}$s may be identical to or differ from each other. In some embodiments, k may be 0, 1, or 2, but is not limited thereto.

According to the organic light-emitting device 100, the anthracene-based compound with improved electron mobility and the carbazole-based compound with electron blocking ability and improved hole transport ability are included in the electron transport layer 170, so that the organic light-emitting device 100 may have improved efficiency and lifetime.

If a lithium complex such as lithium quinolate is used in an electron transport layer to improve electron mobility in the electron transport layer, the lithium quinolate may induce an oxidation reaction with moisture ($H_2O$) and/or oxygen ($O_2$), leading to electron quenching, as illustrated in the following reaction scheme, and a reduced thickness of the electron transporting layer, and the organic light-emitting device may have reduced efficiency and lifetime with lapse of time.

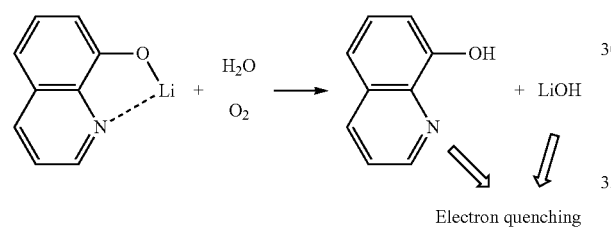

Electron quenching

When the electron transport layer 170 includes an aluminum complex, such as $Alq_3$ (tris-(8-hydroxyquinolinato)aluminum), a similar oxidation reaction as above may occur in the electron transport layer 170, so that the efficiency and lifetime of the organic light-emitting device may also be reduced.

However, to prevent a reduction in efficiency and lifetime of organic light-emitting devices resulting from such oxidation reaction, the organic light-emitting device 100 of FIG. 1 does not use a Li complex such as lithium quinolate, or an aluminum complex such as $Alq_3$. The organic light-emitting device 100 includes, instead of lithium quinolate, the carbazole-based compound in the electron transport layer 170, wherein the carbazole-based compound has improved electron blocking and hole transporting capabilities, and does not generate hydroxide even when it reacts with moisture and/or oxygen. Accordingly, even when a small amount of moisture ($H_2O$) or oxygen ($O_2$) permeate into the electron transport layer 170, oxidation does not take place in the electron transport layer 170, so that electron mobility may remain high in the electron transport layer 170. Lithium quinolate may lower the electron mobility, and thus reduce a driving voltage of the organic light-emitting device. In the organic light-emitting device 100 of FIG. 10, the carbazole-based compound with electron blocking ability may serve the same function as lithium quinolate.

The anthracene-based compound may include one of a compound represented by Formula 2 below, a compound represented by Formula 3 below, and Compound 101:

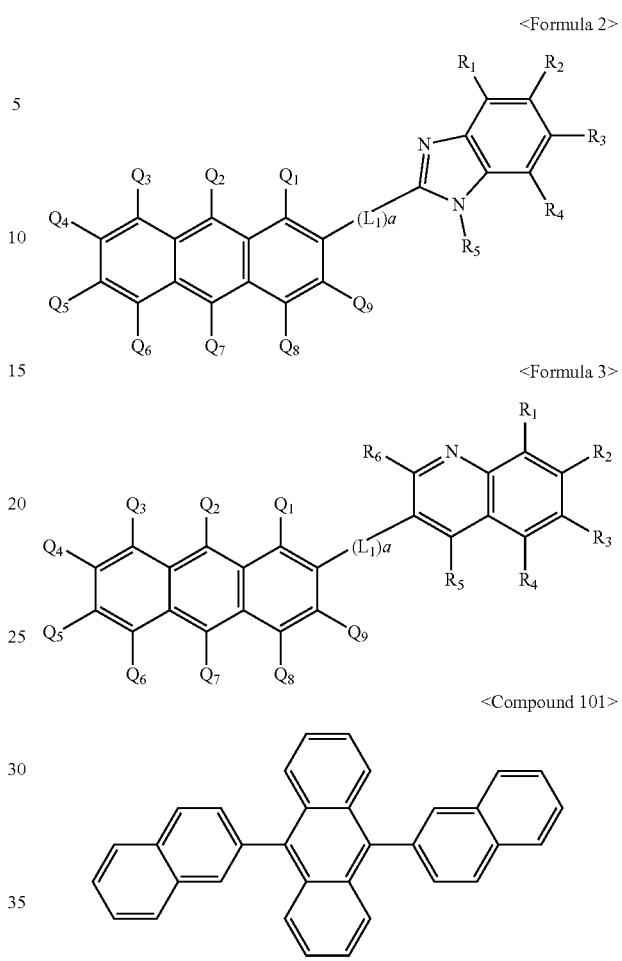

In Formulae 2 and 3, $R_1$ to $R_6$ may be each independently a hydrogen atom, a deuterium atom, a halogen atom, a hydroxy group, a cyano group, a substituted or unsubstituted $C_1$-$C_{30}$ alkyl group, a substituted or unsubstituted $C_1$-$C_{30}$ alkoxy group, a substituted or unsubstituted $C_1$-$C_{30}$ acyl group, a substituted or unsubstituted $C_2$-$C_{30}$ alkenyl group, a substituted or unsubstituted $C_2$-$C_{30}$ alkynyl group, a substituted or unsubstituted $C_6$-$C_{30}$ aryl group, or a substituted or unsubstituted $C_2$-$C_{30}$ heteroaryl group, wherein at least two adjacent groups thereof may be optionally linked to each other to form a saturated or unsaturated ring; $L_1$ may be a single bond, a substituted or unsubstituted $C_1$-$C_{30}$ alkylene group, a substituted or unsubstituted $C_6$-$C_{30}$ arylene group, or a substituted or unsubstituted $C_2$-$C_{30}$ hetero arylene group; $Q_1$ to $Q_9$ may be each independently a deuterium atom, a hydrogen atom, a substituted or unsubstituted $C_6$-$C_{30}$ aryl group, or a substituted or unsubstituted $C_3$-$C_{30}$ heteroaryl group; and a is an integer from 1 to 10.

For example, in Formulae 2 and 3, $R_1$ to $R_6$ may be each independently one of a hydrogen atom, a deuterium atom, a halogen atom, a hydroxy group, a cyano group, a $C_1$-$C_{20}$ alkyl group and a $C_1$-$C_{20}$ alkoxy group; a phenyl group, a naphthyl group, an anthryl group, and a biphenyl group; and a phenyl group, a naphthyl group, and an anthryl group that are substituted with at least one of a deuterium atom, a halogen atom, a hydroxy group, a cyano group, a $C_1$-$C_{20}$ alkyl group, a $C_1$-$C_{20}$ alkoxy group, a phenyl group, a naphthyl group, and an anthryl group, but is not limited thereto.

In Formulae 2 and 3, $L_1$ may be a single bond or a substituted or unsubstituted $C_6$-$C_{30}$ arylene group. For example, $L_1$ may be one of a single bond, a phenylene group, a naphthylene group, an anthrylene group, a pyridinylene group, and pyrimidinylene group; and a phenylene group, a naphthylene group, an anthrylene group, a pyridinylene group, and a pyrimidinylene group that are substituted with at least one of a deuterium atom, a halogen atom, a hydroxy group, a cyano group, a $C_1$-$C_{20}$ alkyl group, a $C_1$-$C_{20}$ alkoxy group, a phenyl group, a naphthyl group, and an anthryl group, but is not limited thereto.

In Formulae 2 and 3, $Q_1$, $Q_3$ to $Q_6$, $Q_8$, and $Q_9$ may be hydrogen atoms. In Formulae 2 and 3, $Q_2$ and $Q_7$ may be each independently one of a hydrogen atom, a deuterium atom, a halogen atom, a hydroxy group, a cyano group, a $C_1$-$C_{20}$ alkyl group, a $C_1$-$C_{20}$ alkoxy group; a phenyl group, a naphthyl group, an anthryl group, and a biphenyl group; and a phenyl group, a naphthyl group, and an anthryl group that are substituted with at least one of a deuterium atom, a halogen atom, a hydroxy group, a cyano group, a $C_1$-$C_{20}$ alkyl group, a $C_1$-$C_{20}$ alkoxy group, a phenyl group, a naphthyl group, and an anthryl group, but is not limited thereto.

In Formulae 2 and 3, "a" indicates the number of $L_1$ s. When a is 2 or greater, two or more $L_1$ may be identical to or differ from each other. In some embodiments, a may be 1, 2, or 3.

For example, the anthracene-based compound may include one of Compounds 101, 102, and 103:

<Compound 101>

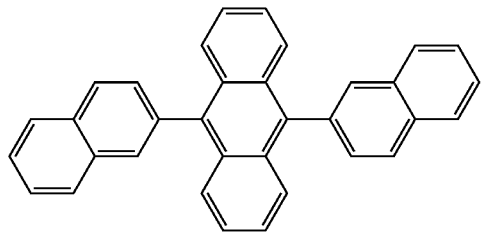

<Compound 102>

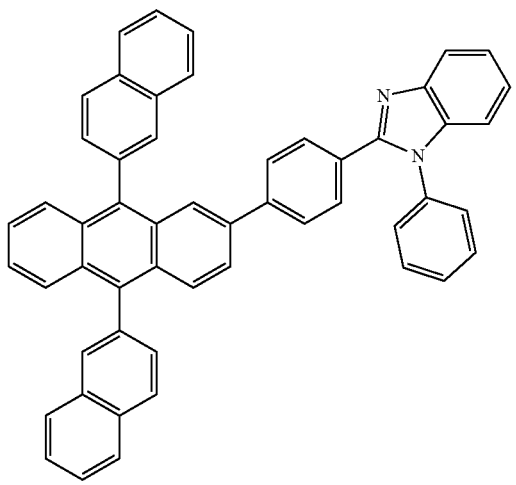

<Compound 103>

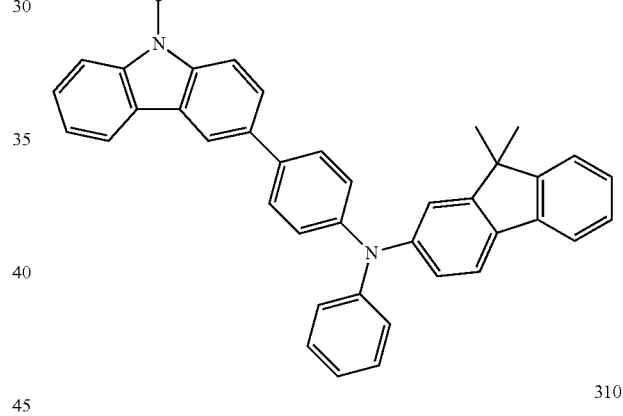

The carbazole-based compound of Formula 1 above may include one of Compounds 309 to 320, but is not limited thereto:

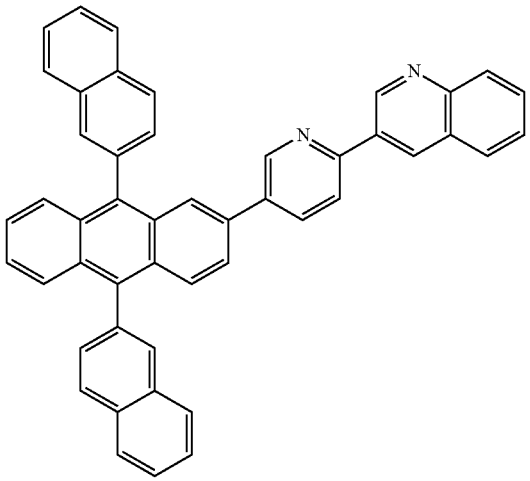

309

310

311
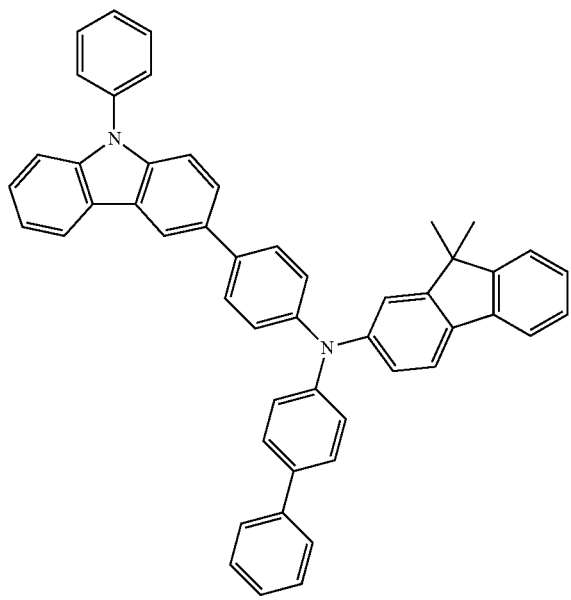
312
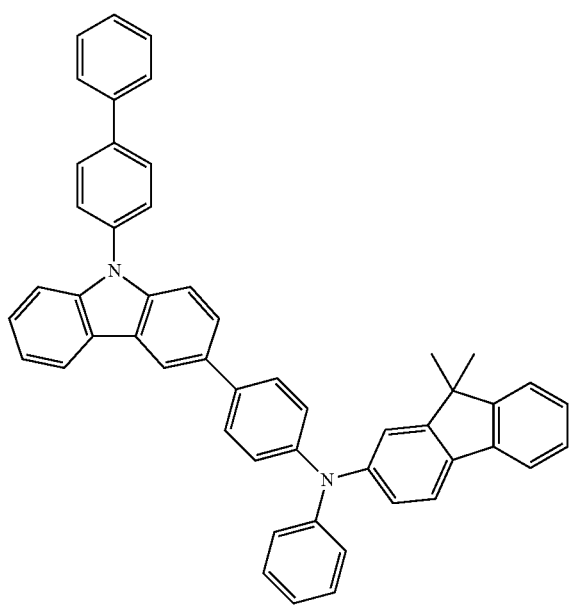
313
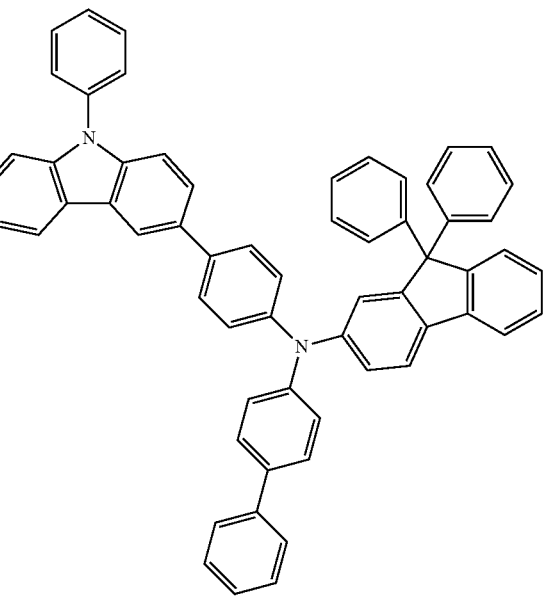
314
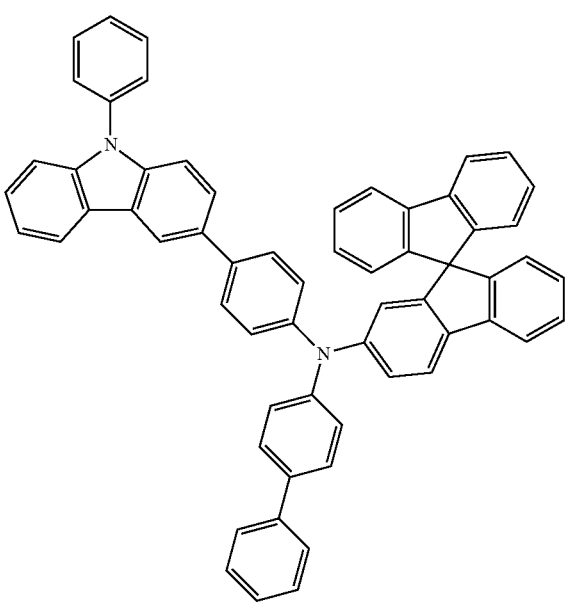

315
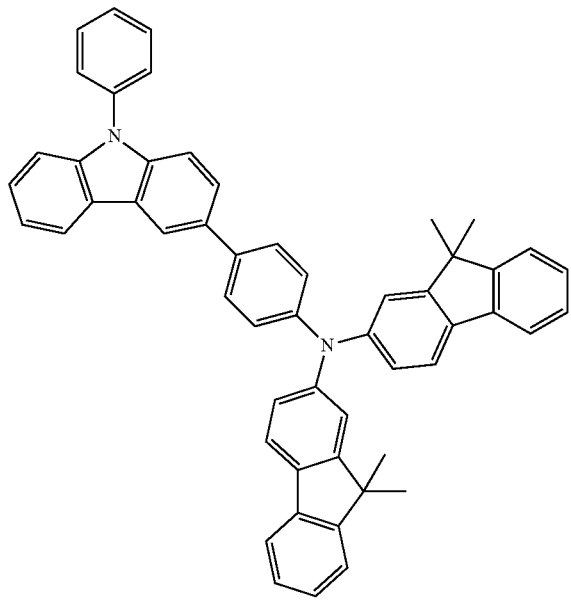
316
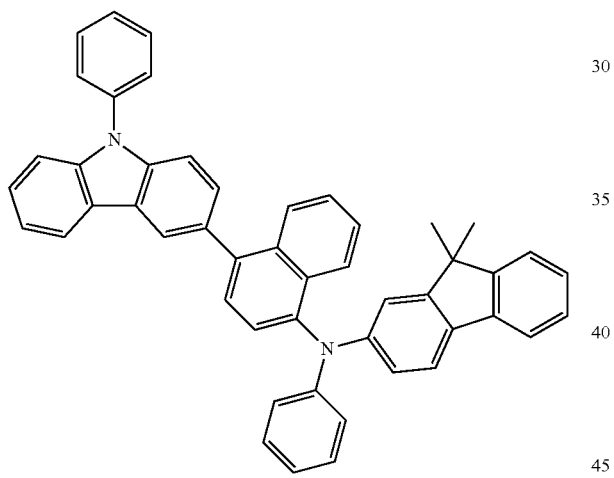
317
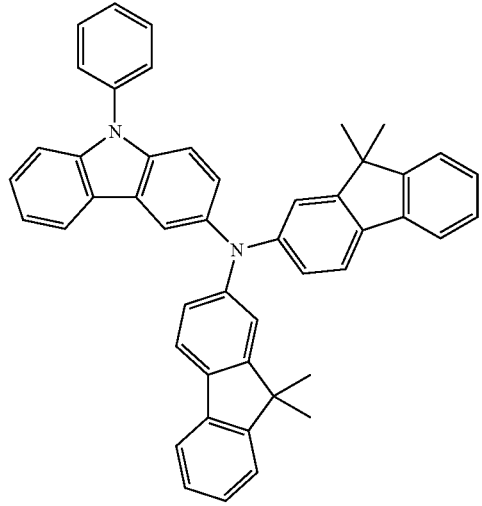
318
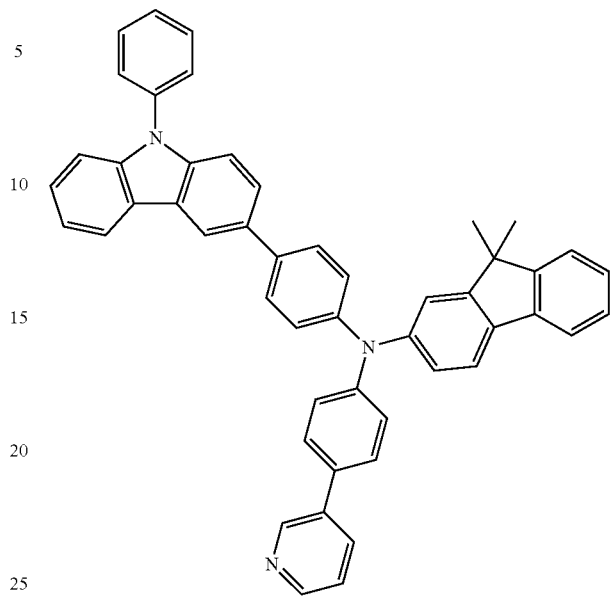
319
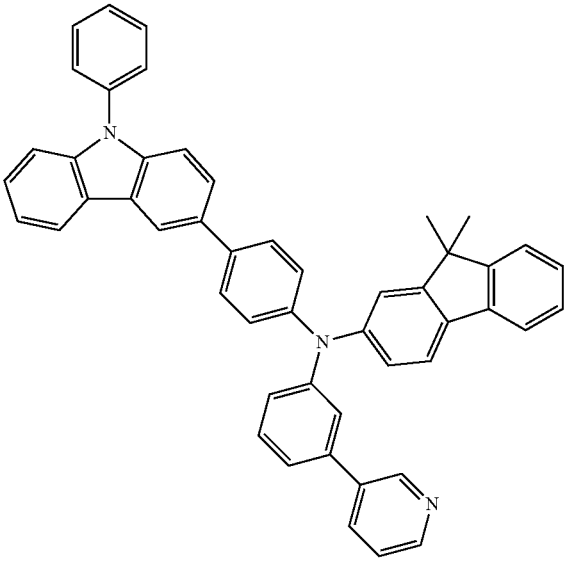

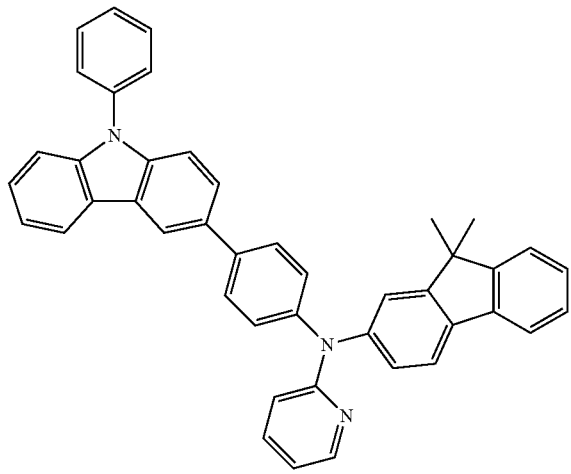

320

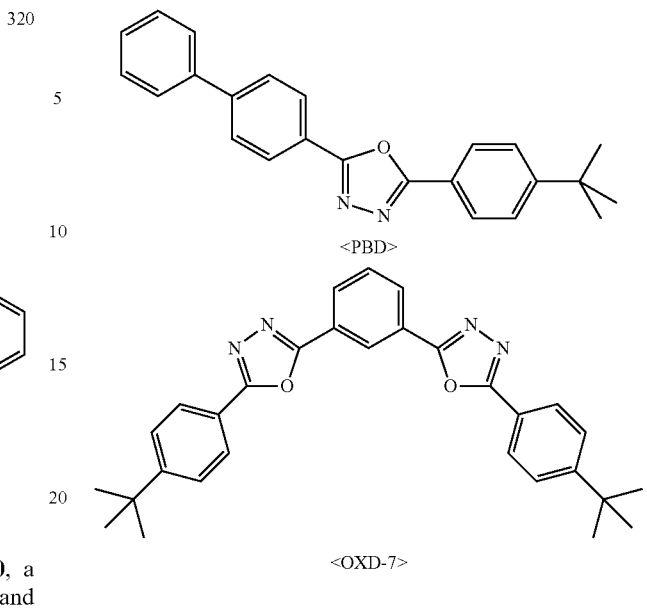

<PBD>

<OXD-7>

<TAZ>

<BCP>

According to the organic light-emitting device 100, a mixed ratio by weight of the anthracene-based compound and the carbazole-based compound in the electron transport layer 170 may be from about 70:30 to about 95:5. When the mixed ratio by weight of the anthracene-based compound and the carbazole-based compound is within this range, the electron transport layer 170 may have improved electron migrating and electron blocking capabilities.

The organic light-emitting device 100 may further include at least one of a hole injection layer, a hole transport layer, and a functional layer having both hole injection and hole transport capabilities between the first electrode 120 and the organic emission layer 160. The hole injection layer and the hole transport layer may facilitate injection and transport of holes.

The organic light-emitting device 100 may further include an electron injection layer (not shown) between the second electrode 190 and the electron transport layer 170. The electron injection layer may facilitate injection of electrons.

The organic light-emitting device 100 may further include a hole blocking layer (not shown) between the organic emission layer 160 and the electron transport layer 170. The hole blocking layer may include at least one of an oxadiazole derivative, a triazole derivative, and a phenanthroline derivative. The hole blocking layer may prevent triplet excitons or holes from diffusing into the electron transport layer 170 that likely occurs when the organic emission layer 160 includes a phosphorescent dopant.

In some embodiments, the organic light-emitting device 100 may further include, in addition to the anthracene-based compound and the carbazole-based compound, an electron-migration retarding material in the electron transport layer 170. When the electron transport layer 170 further includes the electron-migration retarding material, this may lead to a reduced electron mobility in the electron transport layer 170, an increased recombination ratio of holes and electrons in the organic emission layer 160, and balance between hole and electron transports, consequently resulting in improved lifetime and efficiency of the organic light-emitting device 100.

The electron-migration retarding material may include at least one of an oxadiazole derivative, a triazole derivative, and a phenanthroline derivative.

In some embodiments, the electron-migration retarding material may be selected from among the following compounds, but is not limited thereto:

The amount of the electron-migration retarding material may be from 5 wt % to about 30 wt % based on a total weight of the electron transport layer 170. When the amount of the electron-migration retarding material is within this range, the electron mobility in the electron transport layer 170 may be appropriately reduced, so that the lifetime of the organic light-emitting device may be improved to a satisfactory level.

A mixed ratio of the anthracene-based compound and the carbazole-based compound in the electron transport layer 170 of the organic light-emitting device 100 may be from about 70:30 to about 95:5 by weight. When the mixed ratio by weight of the anthracene-based compound and the carbazole-based compound is within this range, the electron transport layer 170 may have improved electron migration and electron blocking capabilities, and no oxidation may occur therein.

The organic light-emitting device 100 may further include at least one of a hole injection layer (not shown) and a hole transport layer (not shown) between the first electrode 120 and the organic emission layer 160. The hole injection layer and the hole transport layer may facilitate injection and transport of holes.

The organic light-emitting device 100 may further include an electron injection layer (not shown) between the second electrode 190 and the electron transport layer 170. The electron injection layer may facilitate injection of electrons.

The organic light-emitting device 100 may further include a hole blocking layer (not shown) between the organic emission layer 160 and the electron transport layer 170. The hole blocking layer may include at least one of an oxadiazole derivative, a triazole derivative, and a phenanthroline derivative. The hole blocking layer may prevent triplet excitons or holes from diffusing into the electron transport layer 170 that likely occurs when the organic emission layer 160 includes a phosphorescent dopant.

According to anther embodiment, a method of manufacturing the organic light-emitting device 100 includes: forming the first electrode 120 on the substrate 110; forming the organic emission layer 160 on the first electrode 120; forming the electron transport layer 170 on the organic emission layer 160 from the anthracene-based compound and the carbazole-based compound represented by Formula 1 below; and forming the second electrode on the electron transport layer:

<Formula 1>

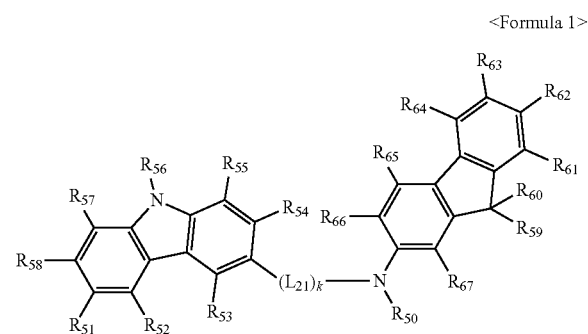

In Formula 1, $R_{50}$ to $R_{67}$, $L_{21}$, and k are as defined above.

According to the organic light-emitting device 100 manufactured using the above method, the anthracene-based compound with improved electron mobility and the carbazole-based compound with electron blocking ability and improved hole transport ability are included in the electron transport layer 170, so that the organic light-emitting device 100 may have improved efficiency and lifetime. Furthermore, even when a small amount of moisture ($H_2O$) or oxygen ($O_2$) permeates into the electron transport layer 170, oxidation reaction with a material of the electron transport layer 170 does not occur, so that electron mobility in the electron transport layer 170 may remain satisfactory even with lapse of time.

Hereinafter, a method of manufacturing the organic light-emitting device 100 will be described in greater detail.

The substrate 110 may be any substrate that is used in existing organic light-emitting devices. In some embodiments, the substrate 11 may be a glass substrate or a transparent plastic substrate with strong mechanical strength, thermal stability, transparency, surface smoothness, ease of handling, and water resistance, but is not limited thereto.

The first electrode 120 is formed on the substrate 110. The first electrode 120 may be formed by depositing or sputtering a first electrode-forming material on the substrate 110. The first electrode 120 may be an anode, wherein a material having a high-work function may be used as the first electrode-forming material to facilitate hole injection. The first electrode 120 may be a transmission electrode or a semi-transmission electrode. The transmission electrode may be formed using a transparent material having high conductivity, for example, ITO, IZO, SnO2, or ZnO. The semi-transmission electrode may be formed using, for example, magnesium (Mg), aluminum (Al), aluminum-lithium (Al—Li), calcium (Ca), magnesium-indium (Mg—In), or magnesium-silver (Mg—Ag).

A hole injection layer (HIL) may further be formed on the first electrode 120, although not illustrated in FIG. 1. The HIL 121 may be formed on the first electrode 120 using any of a variety of methods, such as vacuum deposition, spin coating, casting, Langmuir-Blodgett (LB) deposition, or the like.

When the HIL is formed using a vacuum deposition method, the deposition conditions may differ according to the type of a HIL forming material and the structure and thermal properties of the desired HIL. For example, the disposition temperature may be in a range of 100 to 500° C., the degree of vacuum may be in a range of $10^{-8}$ to $10^{-3}$ torr, and the deposition rate may be in a range of about 0.01 to about 100 Å/sec. When the HIL is formed using spin coating, the coating conditions may vary according to a material that is used to form the HIL, and the structure and thermal properties of the HIL to be formed. In general, however, conditions for spin coating may include a coating rate of about 2000 to about 5000 rpm and a heat treatment temperature of about 80 to 200° C. for removing a solvent after coating.

A HIL material may be any known hole injection material and may be, for example, a phthalocyanine compound such as copper phthalocyanine, 4,4',4"-tris(3-methylphenylphenylamino)triphenylamine (m-MTDATA), TDATA, 2T-NATA, polyaniline/dodecylbenzenesulfonic acid (Pani/DBSA), poly (3,4-ethylenedioxythiophene)/poly(4-styrenesulfonate) (PEDOT/PSS), polyaniline/camphor sulfonicacid (Pani/CSA), or polyaniline/poly(4-styrenesulfonate) (PANI/PSS), but is not limited thereto.

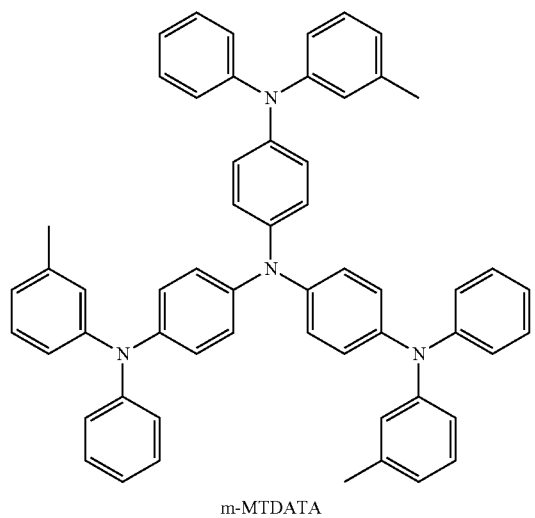

m-MTDATA

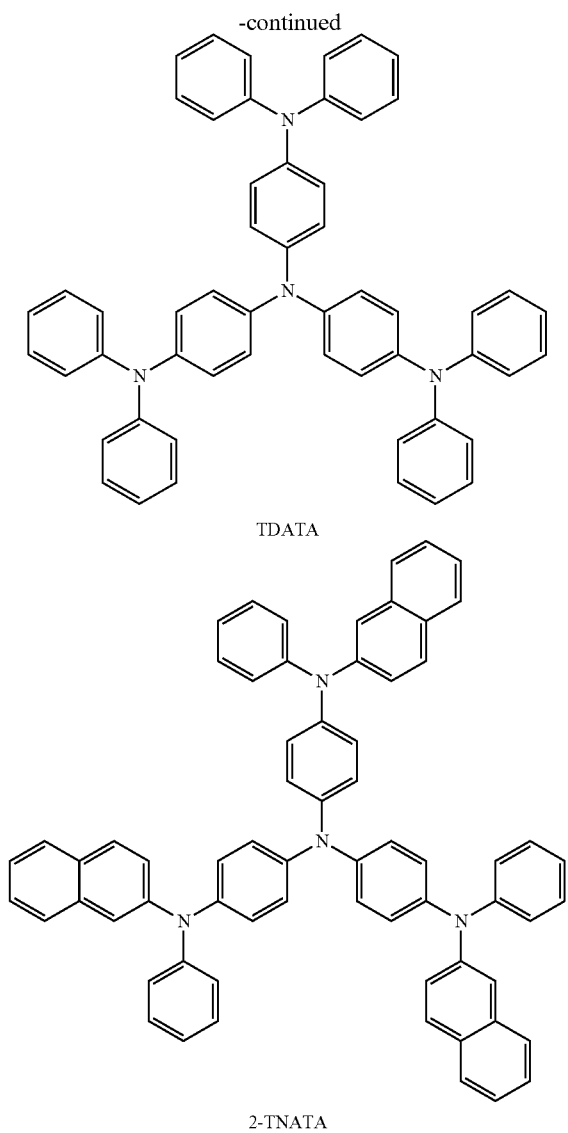

TDATA

2-TNATA

The thickness of the HIL may be from about 100 Å to about 10000 Å, and in some embodiments, may be from about 100 Å to about 1000 Å. When the thickness of the HIL is within these ranges, the HIL may have good hole injecting ability without a substantial increase in driving voltage.

A hole transport layer (HTL) may further be formed on the first electrode 120 or the HIL, although not illustrated in FIG. 1. The HTL may be formed by using any of a variety of methods, such as vacuum deposition, spin coating, casting, LB deposition, or the like. When the HTL is formed using vacuum deposition or spin coating, the deposition and coating conditions may be similar to those for the formation of the HIL, though the deposition and coating conditions may vary according to the material that is used to form the HTL.

A HTL material may be any known hole transport material, and may be, for example, a carbazole derivative such as N-phenylcarbazole or polyvinylcarbazole; an amine derivative having an aromatic condensed ring, such as N,N'-bis(3-methylphenyl)-N,N'-diphenyl-[1,1-biphenyl]-4,4'-diamine (TPD) or N,N'-di(naphthalene-1-yl)-N,N'-diphenyl benzidine (NPB); or a triphenylamine-based material, such as 4,4',4''-tris(N-carbazolyl)triphenylamine (TCTA), but is not limited thereto. TCTA of these materials may not only transport holes but also inhibit excitons from being diffused from the EML.

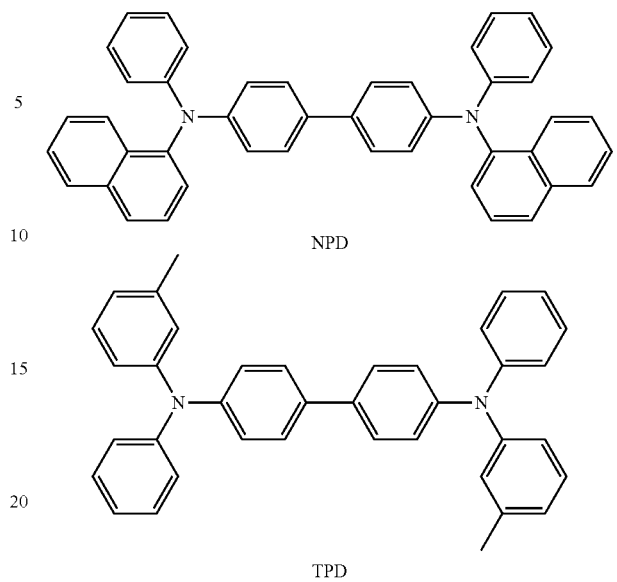

NPD

TPD

The thickness of the HTL may be in a range of from about 50 Å to about 1000 Å, and in some embodiments, may be from about 100 Å to about 800 Å. When the thickness of the HTL is within these ranges, the HTL may have satisfactory electron injection ability without a substantial increase in driving voltage.

The EML 160 may be formed on the HIL or HTL. The organic emission layer 160 may be formed by using, for example, vacuum deposition, spin coating, casting, or Langmuir Blodgett (LB) deposition. When the organic emission layer 160 is formed using vacuum deposition or spin coating, the deposition and coating conditions may be similar to those for the formation of the HIL, though the deposition and coating conditions may vary according to a material that is used to form the organic emission layer.

The organic emission layer 160 may include one light-emitting material, or a combination of a host and a dopant.

Examples of the host are, but are not limited to, Alq3, 4,4'-N,N'-dicarbazole-biphenyl (CBP), 9,10-di(naphthalene-2-yl)anthracene (ADN), TCTA, 1,3,5-tris(N-phenylbenzimidazole-2-yl)benzene (TPBI), 3-tert-butyl-9,10-di-2-naphthylanthracene (TBADN), E3, distyrylarylene (DSA), ADN, Bis (2-(2-hydroxyphenyl)benzothiazolate)zinc (Zn(BTZ)2), Compound 401 below, and Compound 2 below.

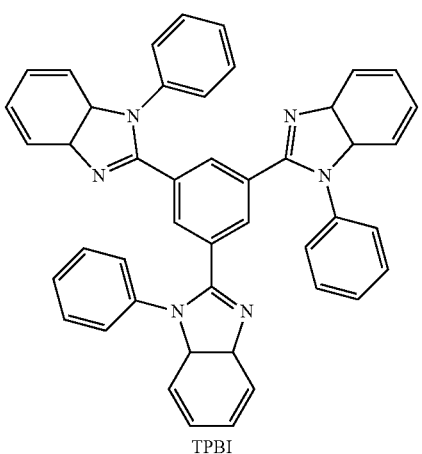

TPBI

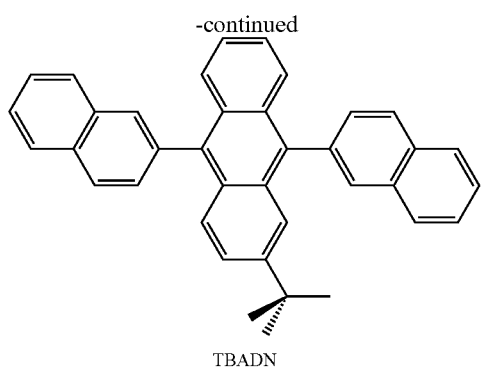
TBADN
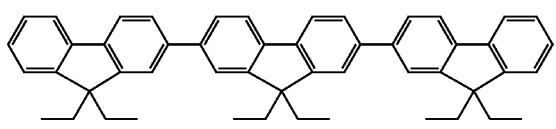
E3
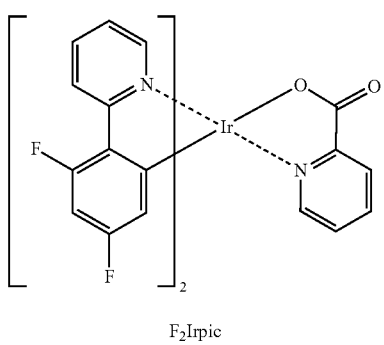
ADN
<Compound 401>
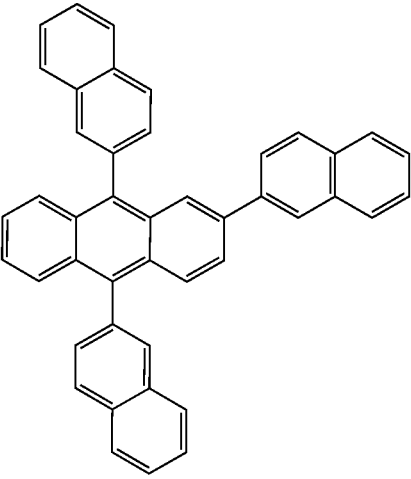
<Compound 402>
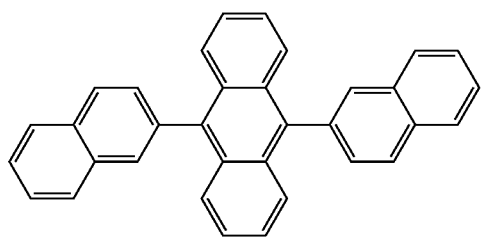
Non-limiting examples of blue dopants are compounds represented by the following formulae.
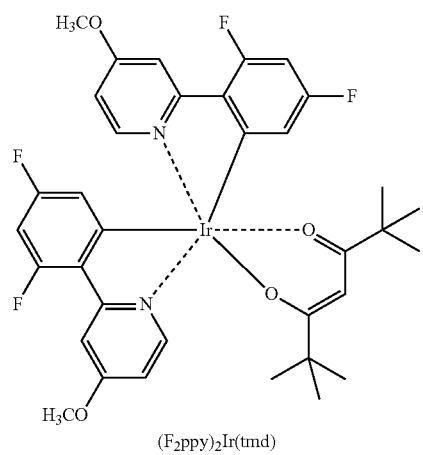
F₂Irpic                (F₂ppy)₂Ir(tmd)

21
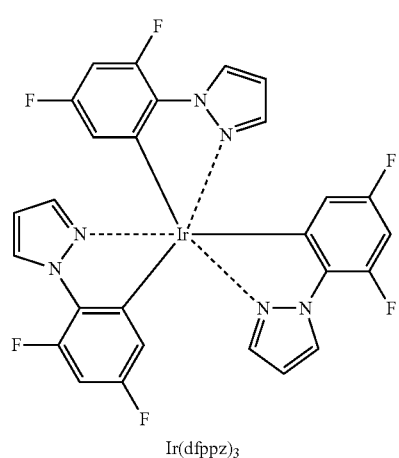
Ir(dfppz)₃
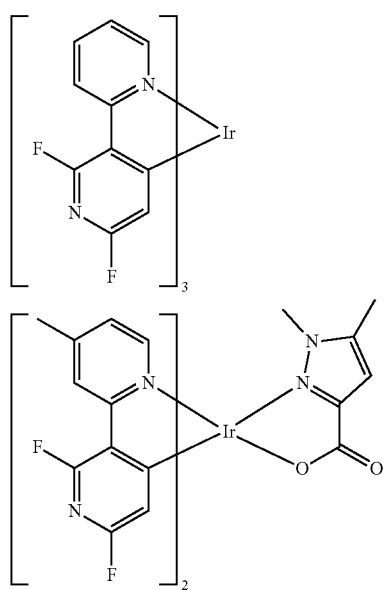
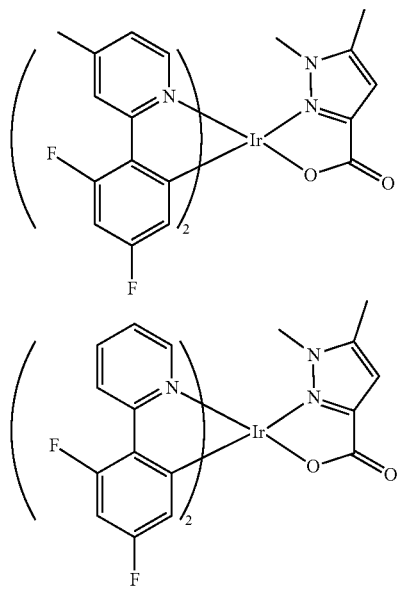
-continued
22
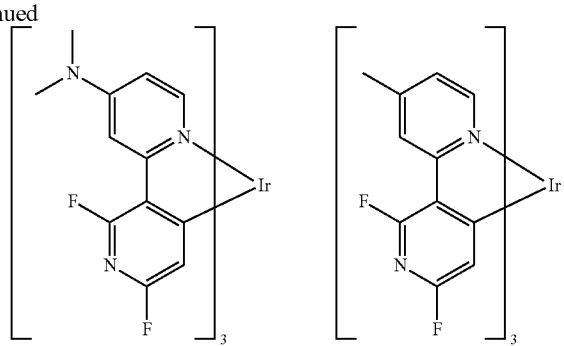
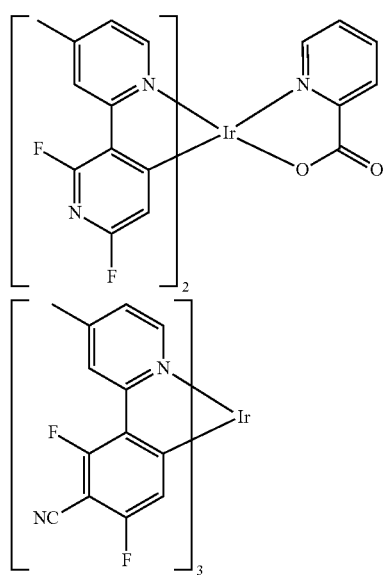
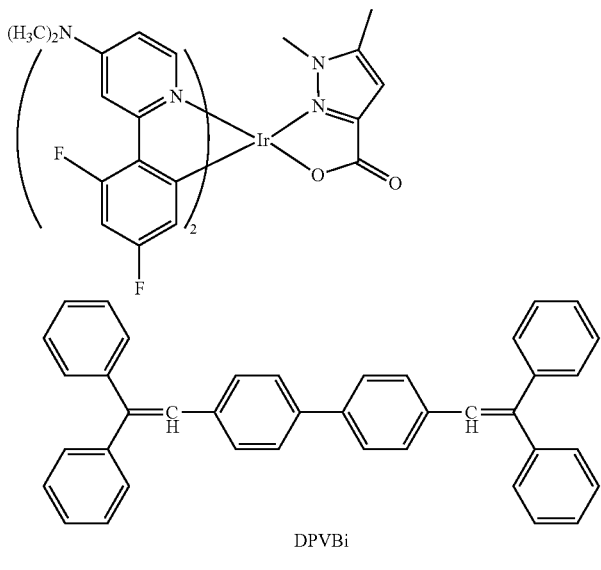
DPVBi

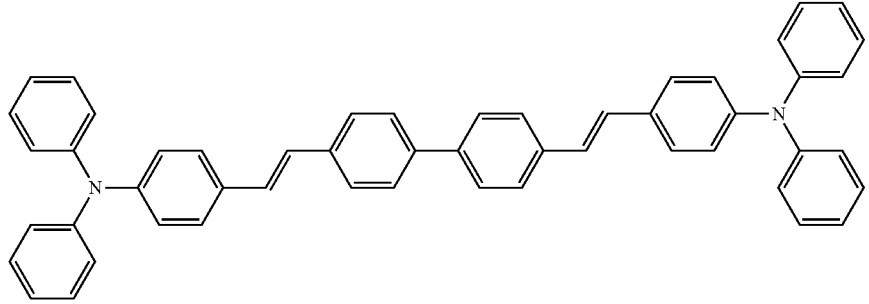
DPAVBi
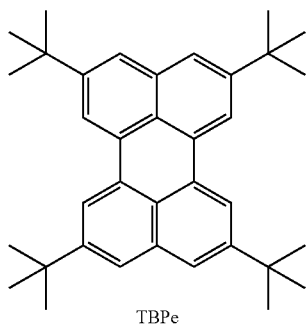
TBPe
Non-limiting examples of red dopant are compounds represented by the following formulae.
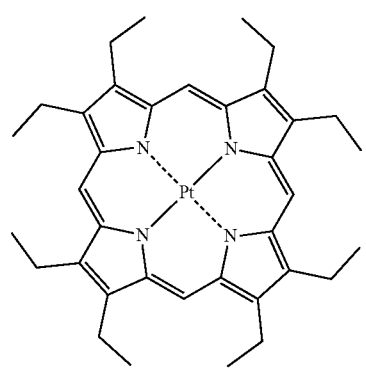
PtOEP
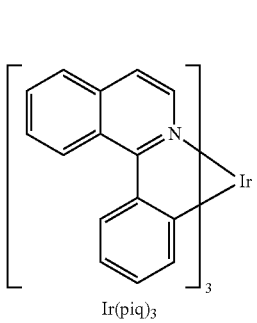
Ir(piq)₃
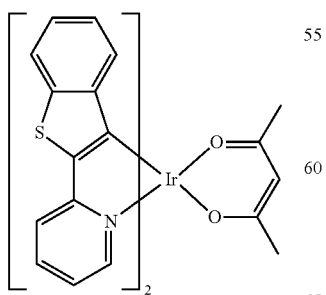
Btp₂Ir(acac)
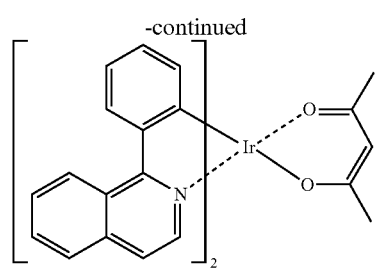
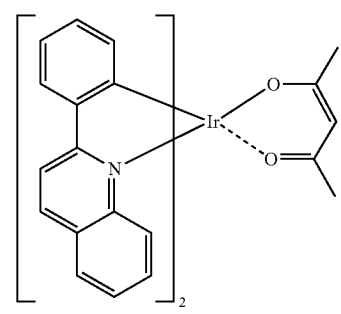
Ir(pq)₂(acac)
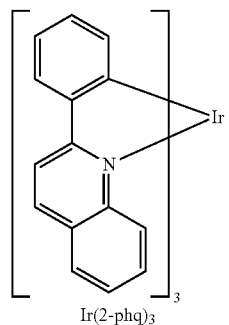
Ir(2-phq)₃

-continued

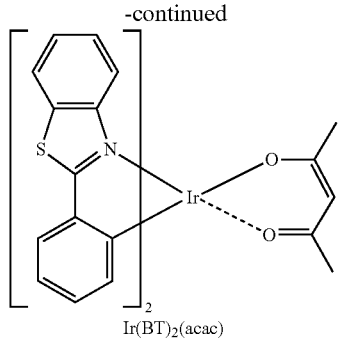
Ir(BT)₂(acac)

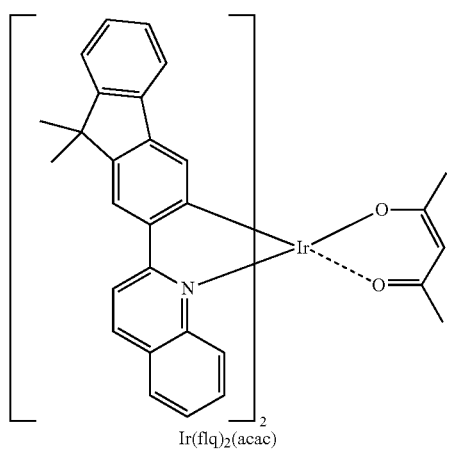
Ir(flq)₂(acac)

Ir(fliq)₂(acac)

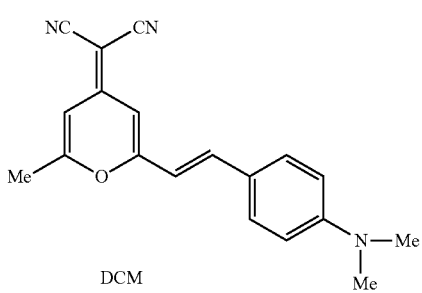
DCM

-continued

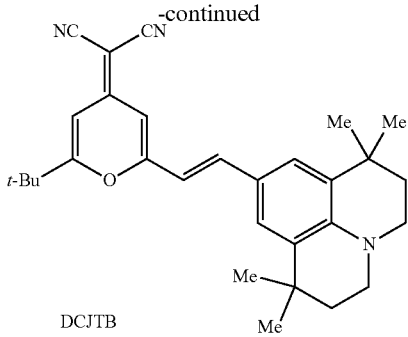
DCJTB

Non-limiting examples of green dopant are compounds represented by the following formulae.

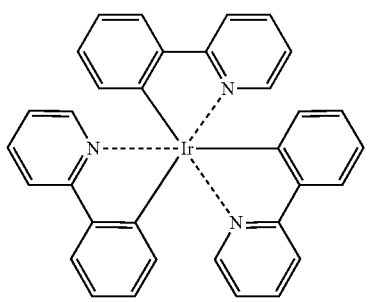
Ir(ppy)₃

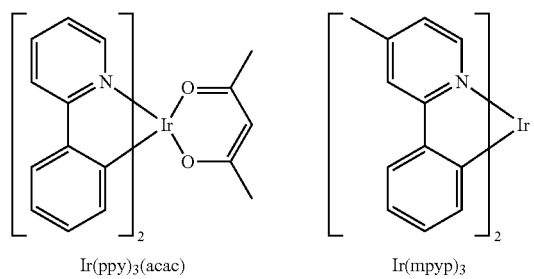
Ir(ppy)₃(acac)    Ir(mpyp)₃

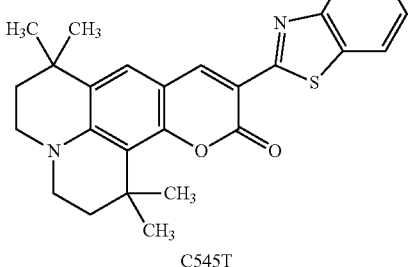
C545T

Non-limiting examples of dopants for the organic emission layer 160 are a Pt-complex and a Os-complex.

When a dopant and a host are used together in the organic emission layer 160, an amount of the dopant may not be limited, for example, may be in a range of about 0.01 to about 15 parts by weight based on 100 parts by weight of the host.

The thickness of the organic emission layer 160 may be from about 100 Å to about 1000 Å, and in some embodiments, may be from about 200 Å to about 600 Å. When the thickness of the organic emission layer 160 is within these ranges, the organic emission layer 160 may have improved light emitting ability without a substantial increase in driving voltage.

The organic emission layer 160 may be formed by using vacuum deposition, spin coating, casting, LB deposition, or the like. When the organic emission layer 160 is formed using vacuum deposition or spin coating, the deposition and coating conditions may be similar to those for the formation of the HIL, though the deposition and coating conditions may vary according to a material that is used to form the organic emission layer 160.

A hole blocking layer (HBL) may further be formed on the organic emission layer 160, although not illustrated in FIG. 1. When a phosphorescent dopant is also used in the organic emission layer 160, the HBL may be formed on the organic emission layer 160 by using vacuum deposition, spin coating, casting, Langmuir-Blodgett (LB) deposition, or the like, in order to prevent diffusion of triplet excitons or holes into the electron transport layer 170. When the HBL is formed using vacuum deposition or spin coating, the deposition and coating conditions may be similar to those for the formation of the HIL, though the deposition and coating conditions may vary according to a material that is used to form the HBL. For example, a material for forming the HBL may be at least one of an oxadiazole derivative, a triazole derivative, and a phenanthroline derivative. The thickness of the HBL may be in a range of from about 50 Å to about 1000 Å, and in some embodiments, may be from about 100 Å to about 300 Å. When the thickness of the HBL is within these ranges, the HBL may have improved hole blocking properties without a substantial decrease in driving voltage.

The electron transport layer 170 may be formed on the organic emission layer 160 or the HBL. The electron transport layer 170 may be formed by co-depositing the anthracene-based compound and the carbazole-based compound of Formula 1 above 1. In some embodiments the electron transport layer 170 may be formed by co-depositing the anthracene-based compound, the carbazole-based compound of Formula 1 above, and an electron-migration retarding material. When the electron transport layer 170 further include the electron-migration retarding material, the electron mobility in the electron transport layer 170 may be lowered, so that the organic light-emitting device 100 may have further improved lifetime. The electron-migration regarding material may be a triphenylamine derivative, a carbazole derivative, or a spirofluorene derivative.

The electron transport layer 170 may be formed by co-depositing the anthracene-based compound and the carbazole-based compound in a mixed ratio of about 70:30 to about 95:5 by weight. When the mixed ratio by weight of the anthracene-based compound and the carbazole-based compound is within this range, the electron transport layer 170 may have improved electron migration and electron blocking capabilities, and no oxidation may occur therein.

When the electron transport layer 170 further includes an electron-migration retarding material, in addition to the anthracene-based compound and the carbazole-based compound, the electron transport layer 170 may be formed by co-depositing the three materials to include about 5 wt % to about 30 wt % of the electron-migration retarding material based on a total weight of the electron transport layer 170 When the amount of the electron-migration retarding material is within this range, the electron mobility in the electron transport layer 170 may be appropriately reduced, so that the lifetime of the organic light-emitting device 100 may be improved to a satisfactory level.

The thickness of the electron transport layer 170 may be from about 50 Å to about 1,000 Å, and in some embodiments, may be from about 100 Å to about 500 Å. When the thickness of the electron transport layer 170 is within these ranges, the electron transport layer 170 may have satisfactory electron transporting ability without a substantial increase in driving voltage.

An electron injection layer may be further formed on the electron transport layer 170, although not illustrated in FIG. 1. The electron injection layer may facilitate injection of electrons from the cathode. Examples of a material for forming the electron injection layer are LiF, NaCl, CsF, $Li_2O$, and BaO, which are known in the art. The deposition and coating conditions for forming the electron injection layer may be similar to those for the formation of the HIL, though the deposition and coating conditions may vary according to the material that is used to form the electron injection layer.

The thickness of the electron injection layer may be from about 1 Å to about 100 Å, and in some embodiments, may be from about 3 Å to about 90 Å. When the thickness of the electron injection layer is within these ranges, the electron injection layer may have satisfactory electron injecting ability without a substantial increase in driving voltage.

The second electrode 190 may be formed on the electron transport layer 170 or the electron injection layer. The second electrode 190 may be a cathode, which is an electron injecting electrode. A metal for forming the second electrode 150 may be a metal, an alloy, an electrically conductive compound, which have a low-work function, or a mixture thereof. In some embodiments, the second electrode 190 as a transmission electrode may be formed as a thin film of Li, Mg, Al, Al—Li, Ca, Mg—In, Mg—Ag, or the like. In some embodiments, to manufacture a top-emission light-emitting device, the transmission electrode may comprise indium tin oxide (ITO) or indium zinc oxide (IZO).

As used herein, examples of the "unsubstituted $C_1$-$C_{30}$ alkyl group" (or "$C_1$-$C_{30}$ alkyl group") are linear or branched $C_1$-$C_{30}$ alkyl groups, such as methyl, ethyl, propyl, isobutyl, sec-butyl, pentyl, iso-amyl, or hexyl. Examples of the substituted $C_1$-$C_{30}$ alkyl group are the unsubstituted $C_1$-$C_{30}$ alkyl group of which at least one hydrogen atom is substituted with one of a deuterium atom, a halogen, a hydroxyl group, a cyano group, an amino group, a nitro group, an amidino group, a hydrazine, a hydrazone, a carboxyl group or a salt thereof, a sulfonic acid group or a salt thereof, a phosphoric acid group or a salt thereof, a $C_1$-$C_{30}$ alkyl group, a $C_2$-$C_{30}$ alkenyl group, a $C_2$-$C_{30}$ alkynyl group, a $C_1$-$C_{30}$ alkoxy group, a $C_3$-$C_{10}$ cycloalkyl group, a $C_3$-$C_{10}$ cycloalkenyl group, a $C_6$-$C_{30}$ aryl group, a $C_6$-$C_{30}$ aryloxy group, a $C_6$-$C_{30}$ arylthio group, a $C_2$-$C_{30}$ heteroaryl group, —$N(Q_{101})(Q_{102})$, and —$Si(Q_{103})(Q_{104})(Q_{105})(Q_{106})$ (where $Q_{101}$ to $Q_{106}$ are each independently one of a hydrogen atom, a $C_1$-$C_{30}$ alkyl group, a $C_2$-$C_{30}$ alkenyl group, a $C_2$-$C_{30}$ alkynyl group, a $C_6$-$C_{30}$ aryl group, and a $C_2$-$C_{30}$ heteroaryl group).

As used herein, the unsubstituted $C_2$-$C_{30}$ alkenyl group (or a $C_2$-$C_{30}$ alkenyl group) is a hydrocarbon chain having a carbon-carbon double bond in the center or at a terminal of the unsaturated $C_2$-$C_{30}$ alkyl group. Examples of the unsubstituted $C_2$-$C_{30}$ alkenyl group are ethenyl, propenyl, and butenyl groups. The substituted $C_2$-$C_{30}$ alkenyl group is a $C_2$-$C_{30}$ alkenyl group of which at least one hydrogen atom is substituted with those substituents described above in conjunction with the substituted $C_1$-$C_{30}$ alkyl group.

As used herein, the unsubstituted $C_2$-$C_{30}$ alkynyl group (or $C_2$-$C_{30}$ alkynyl group) is a hydrocarbon chain having a carbon-carbon triple bond I the center or at a terminal of the above-defined $C_2$-$C_{30}$ alkyl group. Examples of the unsubstituted $C_2$-$C_{30}$ alkynyl group are ethynyl and propynyl groups. The substituted $C_2$-$C_{30}$ alkynyl group is a $C_2$-$C_{30}$ alkynyl group of which at least one hydrogen atom is substituted with those substituents described above in conjunction with the substituted $C_1$-$C_{30}$ alkyl group.

As used herein, the unsubstituted $C_1$-$C_{30}$ alkoxy group (or $C_1$-$C_{30}$ alkoxy group) may be represented by the formula of —OA (wherein A is an unsubstituted $C_1$-$C_{30}$ alkyl group as describe above). Examples of the unsubstituted $C_1$-$C_{30}$ alkoxy group are methoxy, ethoxy, and isopropyloxy groups. The substituted $C_1$-$C_{30}$ alkoxy group is a $C_1$-$C_{30}$ alkoxy group of which at least one hydrogen atom is substituted with those substituents described above in conjunction with the substituted $C_1$-$C_{30}$ alkyl group.

As used herein, the unsubstituted $C_3$-$C_{10}$ cycloalkyl group (or $C_3$-$C_{10}$ cycloalkyl group) may be a saturated $C_3$-$C_{30}$ monocyclic, bicyclic, or tricyclic non-aromatic hydrocarbon group. Non-limiting examples thereof are cyclopropyl, cyclobutyl, cyclopentyl, cyclohexyl, cycloheptyl, cyclooctyl, and decahydronaphthalenyl. The substituted $C_3$-$C_{10}$ cycloalkyl group is a $C_3$-$C_{10}$ cycloalkyl group of which at least one hydrogen atom is substituted with those substituents described above in conjunction with the substituted $C_1$-$C_{30}$ alkyl group.

As used herein, the unsubstituted $C_3$-$C_{10}$ cycloalkenyl group (or $C_3$-$C_{10}$ cycloalkenyl group) may be an unsaturated $C_3$-$C_{10}$ monocyclic, bicyclic, or tricyclic non-aromatic hydrocarbon group. Non-limiting examples thereof are cyclopentenyl, and cyclohexcenyl. The substituted $C_3$-$C_{10}$ cycloalkenyl group is a $C_3$-$C_{10}$ cycloalkenyl group of which at least one hydrogen atom is substituted with those substituents described above in conjunction with the substituted $C_1$-$C_{30}$ alkyl group.

As used herein, the unsubstituted $C_6$-$C_{30}$ aryl group is a monovalent group having a carbocyclic aromatic system having 6 to 30 carbon atoms including at least one aromatic ring. The unsubstituted $C_6$-$C_{60}$ arylene group is a divalent group having a carbocyclic aromatic system having 6 to 60 carbon atoms including at least one aromatic ring. When the aryl group and the arylene group, respectively, have at least two rings, they may be fused to each other. The substituted $C_6$-$C_{30}$ aryl group is a $C_6$-$C_{30}$ aryl group of which at least one hydrogen atom is substituted with those substituents described above in conjunction with the substituted $C_1$-$C_{30}$ alkyl group. The substituted $C_6$-$C_{30}$ arylene group is a $C_6$-$C_{30}$ arylene group of which at least one hydrogen atom is substituted with those substituents described above in conjunction with the substituted $C_1$-$C_{30}$ alkyl group.

As used herein, the unsubstituted $C_6$-$C_{30}$ aryloxy group indicates —$OA_2$ (where $A_2$ is a substituted or unsubstituted $C_6$-$C_{30}$ aryl group described above). The substituted $C_6$-$C_{30}$ aryloxy group is a $C_6$-$C_{30}$ aryloxy group of which at least one hydrogen atom is substituted with those substituents described above in conjunction with the substituted $C_1$-$C_{30}$ alkyl group.

As used herein, the unsubstituted $C_6$-$C_{30}$ arylthio group indicates —$SA_3$ (where $A_3$ is a substituted or unsubstituted $C_3$-$C_{30}$ aryl group described above). The substituted $C_6$-$C_{30}$ arylthio group is a $C_6$-$C_{30}$ arylthio group of which at least one hydrogen atom is substituted with those substituents described above in conjunction with the substituted $C_1$-$C_{30}$ alkyl group.

As used herein, the unsubstituted $C_2$-$C_{30}$ heteroaryl group is a monovalent group having at least one aromatic ring having at least one of the heteroatoms selected from the group consisting of N, O, P, and S, and at least one carbon atom. The unsubstituted $C_2$-$C_{30}$ heteroarylene group is a bivalent group having at least one aromatic ring having at least one of the heteroatoms selected from the group consisting of N, O, P, and S and at least one carbon atom. In this regard, when the heteroaryl group and the heteroarylene group, respectively, have at least two rings, they may be fused to each other. The substituted $C_2$-$C_{30}$ heteroaryl group is a $C_2$-$C_{30}$ heteroaryl group of which at least one hydrogen atom is substituted with those substituents described above in conjunction with the substituted $C_1$-$C_{30}$ alkyl group. The substituted $C_2$-$C_{30}$ heteroarylene group is a $C_2$-$C_{30}$ heteroarylene group of which at least one hydrogen atom is substituted with those substituents described above in conjunction with the substituted $C_1$-$C_{30}$ alkyl group.

According to another embodiment, an organic light-emitting display apparatus includes a transistor with a source a drain, a gate, and an active layer, and the above-described organic light-emitting device, wherein one of the source and the drain is electrically connected to the first electrode of the organic light-emitting device. The active layer of the transistor may be any of a variety layers, for example, an amorphous silicon layer, a crystalline silicon layer, an organic semiconductor layer, or an oxide semiconductor layer.

Due the inclusion of the organic light-emitting device with the electron transpolar layer including the anthracene-based compound with improved electron-migration ability and the carbazole-based compound with electron blocking ability and improved hole transporting capability, the organic light-emitting display apparatus may have improved efficiency and lifetime. Even when a small amount of moisture or oxygen permeates into the electron transport layer of the organic light-emitting devices, oxidation does not occur so that the efficiency and lifetime of the organic light-emitting display apparatus may remain high even with lapse of time.

One or more embodiments will now be described in detail with reference to the following examples. However, these examples are not intended to limit the scope of the one or more embodiments.

Example 1

To manufacture an anode, a corning 15 Ω/cm2 (1200 Å) ITO glass substrate was cut to a size of 50 mm×50 mm×0.7 mm and then sonicated in isopropyl alcohol and pure water each for five minutes, and then cleaned by ultrasonication, followed by ultraviolet (UV) irradiation for about 30 minutes, and exposure to ozone for washing. The resulting glass substrate was loaded into a vacuum deposition device.

2-TNATA was vacuum-deposited on the ITO glass substrate to form an HIL having a thickness of 600 Å on the anode, and then NPB was vacuum-deposited on the HIL to form a HTL having a thickness of 300 Å.

DNA as a blue fluorescent host and DPVBi as a blue fluorescent dopant were co-deposited in a weight ratio of 98:2 on the HTL to form an EML having a thickness of about 300 Å.

Compound 102 and Compound 311 were co-deposited in a weight ratio of 90:10 on the EML to form an ETL having a thickness of about 360 Å.

Al was vacuum-deposited on the ETL to form a cathode having a thickness of about 3000 Å, thereby completing the manufacture of an organic light-emitting device.

<Compound 102>

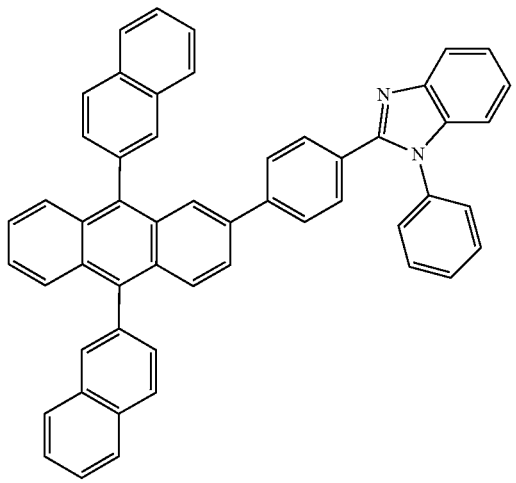

311

<Compound 311>

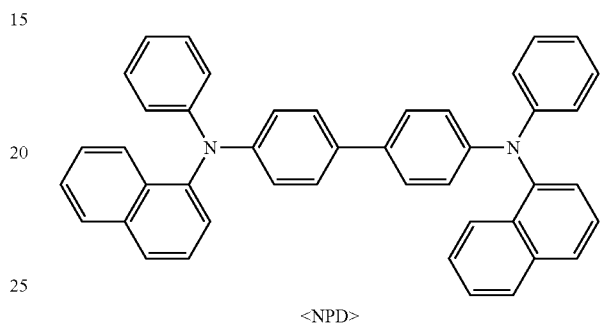

<NPD>

Example 2

An organic light-emitting device was manufactured in the same manner as in Example 1, except that Compound 102, Compound 311, and BCP were co-deposited in a weight ratio of 90:10:10 to form an ETL having a thickness of about 360 Å.

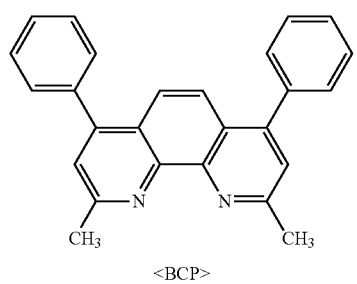 [SMILES: Cc1cc(-c2ccccc2)c2ccc3c(-c4ccccc4)cc(C)nc3c2n1]

<BCP>

Comparative Example 1

An organic light-emitting device was manufactured in the same manner as in Example 1, except that $Alq_3$ and lithium quinolate (LiQ) were co-deposited in a weight ratio of 1:1 to form an ETL having a thickness of about 360 Å.

Comparative Example 2

An organic light-emitting device was manufactured in the same manner as in Example 1, except that $Alq_3$ and NPB were co-deposited in a weight ratio of 10:1 to form an ETL having a thickness of about 360 Å.

Evaluation Example 1

Driving voltage, luminance, luminescent efficiency, color purity and lifetime of the organic light-emitting devices of Examples 1 and 2 and Comparative Examples 1 and 2 were measured using a PR650 (Spectroscan) source measurement unit (available from PhotoResearch, Inc.). The results are shown in Table 1 below. In Table 1, T97 lifetime indicates the time taken until an initial luminance (assumed as 100%) measured at a current density of about 25 $mA/cm^2$ is reduced to 97%.

TABLE 1

| Example | Driving voltage (V) | Current density ($mA/cm^2$) | Luminance ($cd/m^2$) | Luminescent efficiency (cd/A) | Light color | $LT_{97}$ lifetime (hr @25 $mA/cm^2$) |
|---|---|---|---|---|---|---|
| Example 1 | 6.4 | 22.9 | 601 | 2.6 | blue | 21 |
| Example 2 | 6.5 | 24.8 | 560 | 2.3 | blue | 18 |
| Comparative Example 1 | 7.1 | 25.8 | 545 | 1.8 | blue | 15 |
| Comparative Example 2 | 7.5 | 29.2 | 530 | 1.2 | blue | 12 |

Referring to Table 1, the organic light-emitting devices of Examples 1 and 2 are found to have improved efficiency and lifetime, as compared with the organic light-emitting devices of Comparative Examples 1 and 2.

As described above, according to the one or more of the above embodiments, due to having the electron transport layer including an anthracene-based compound with improved electron migration ability and a carbazole-based compound with electron blocking ability and improved hole transport capability, the organic light-emitting device may have improved efficiency and lifetime.

It should be understood that the example embodiments described therein should be considered in a descriptive sense only and not for purposes of limitation. Descriptions of features or aspects within each embodiment should typically be considered as available for other similar features or aspects in other embodiments.

What is claimed is:

1. An organic light-emitting device comprising:
a substrate;
a first electrode;
a second electrode disposed opposite to the first electrode;
an organic emission layer disposed between the first electrode and the second electrode; and
an electron transport layer disposed between the organic emission layer and the second electrode and comprising an anthracene-based compound and a carbazole-based compound represented by Formula 1 below:

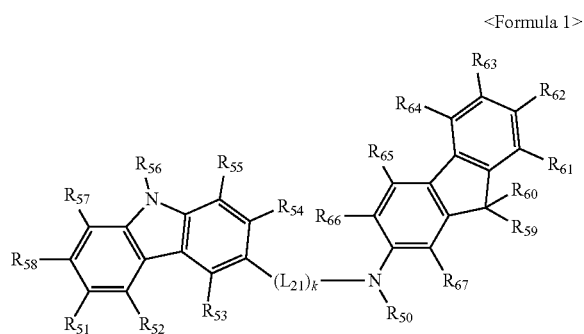

<Formula 1> wherein $R_{50}$ is one of a substituted or unsubstituted phenyl group, a substituted or unsubstituted naphthyl group, a substituted or unsubstituted anthryl group, a substituted or unsubstituted biphenyl group, and a substituted or unsubstituted pyridinyl group;

$L_{21}$ is one of a substituted or unsubstituted $C_1$-$C_{30}$ alkylene group, a substituted or unsubstituted $C_2$-$C_{30}$ alkenylene group, a substituted or unsubstituted $C_6$-$C_{30}$ arylene group, and a substituted or unsubstituted $C_2$-$C_{30}$ hetero arylene group;

$R_{51}$ to $R_{67}$ are each independently one of a hydrogen atom, a deuterium atom, halogen, hydroxyl group, cyano group, nitro group, carboxyl group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_1$-$C_{30}$ alkylthio group, a substituted or unsubstituted $C_3$-$C_{10}$ cycloalkyl group, a substituted or unsubstituted $C_3$-$C_{10}$ cycloalkenyl group, a substituted or unsubstituted $C_6$-$C_{30}$ aryl group, a substituted or unsubstituted $C_6$-$C_{30}$ aryloxy group, a substituted or unsubstituted $C_6$-$C_{30}$ arylthio group, a substituted or unsubstituted $C_2$-$C_{30}$ heteroaryl group, and —N($Q_{11}$)($Q_{12}$), where $Q_{11}$ and $Q_{12}$ are each independently one of a hydrogen atom, a deuterium atom, a halogen, a hydroxyl group, a cyano group, a amino group, a nitro group, a carboxyl group, a $C_1$-$C_{30}$ alkyl group, a $C_2$-$C_{30}$ alkenyl group, a $C_2$-$C_{30}$ alkynyl group, a $C_1$-$C_{30}$ alkoxy group, a $C_1$-$C_{30}$ alkylthio group, a $C_3$-$C_{10}$ cycloalkyl group, a $C_3$-$C_{10}$ cycloalkenyl group, a $C_6$-$C_{30}$ aryl group, a $C_6$-$C_{30}$ aryloxy group, a $C_6$-$C_{30}$ arylthio group, and a $C_2$-$C_{30}$ heteroaryl group; and k is an integer from 0 to 3.

2. The organic light-emitting device of claim 1, wherein $R_{50}$ is one of a phenyl group, a naphthyl group, an anthryl group, a biphenyl group, and a pyridinyl group; and a phenyl group, a naphthyl group, an anthryl group, a biphenyl group, and a pyridinyl group that are substituted with at least one of a deuterium atom, a halogen atom, a cyano group, a hydroxyl group, an amino group, a $C_1$-$C_{20}$ alkyl group, a $C_1$-$C_{20}$ alkoxy group, a phenyl group, a naphthyl group, an anthryl group, and a pyridinyl group.

3. The organic light-emitting device of claim 1, wherein $L_{21}$ is one of a phenylene group, a naphthylene group, an anthrylene group, a phenanthrenyl group, a pyridinylene group, and pyrimidinylene group; and a phenylene group, a naphthylene group, an anthrylene group, a phenanthrenyl group, a pyridinylene group, and a pyrimidinylene group that are substituted with at least one of a deuterium atom, a halogen atom, a cyano group, a hydroxyl group, an amino group, a $C_1$-$C_{20}$ alkyl group, a $C_1$-$C_{20}$ alkoxy group, a phenyl group, a naphthyl group, an anthryl group, and a pyridinyl group.

4. The organic light-emitting device of claim 1, wherein
$R_{51}$ to $R_{55}$, $R_{57}$, $R_{58}$, and $R_{61}$ to $R_{67}$ are hydrogen atoms; and
$R_{56}$, $R_{60}$, and $R_{59}$ are each independently one of a $C_1$-$C_{20}$ alkyl group, a $C_1$-$C_{20}$ alkoxy group, a phenyl group, a naphthyl group, an anthryl group, a biphenyl group, and a pyridinyl group; and a phenyl group, a naphthyl group, an anthryl group, a biphenyl group, and a pyridinyl group that are substituted with at least one of a deuterium atom, a halogen atom, a cyano group, a hydroxyl group, an amino group, a $C_1$-$C_{20}$ alkyl group, a $C_1$-$C_{20}$ alkoxy group, a phenyl group, a naphthyl group, an anthryl group, and a pyridinyl group.

5. The organic light-emitting device of claim 1, wherein k is 0, 1 or 2.

6. The organic light-emitting device of claim 1, wherein the anthracene-based compound comprises at least one of a compound represented by Formula 2 below, a compound represented by Formula 3 below, and Compound 101 represented below:

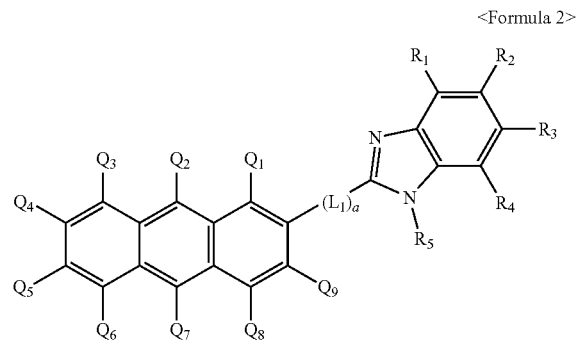

<Formula 2>

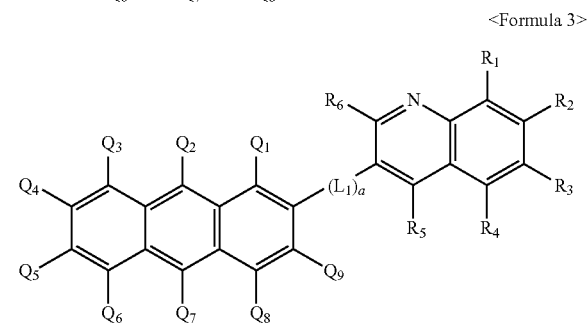

<Formula 3>

-continued

<Compound 101>

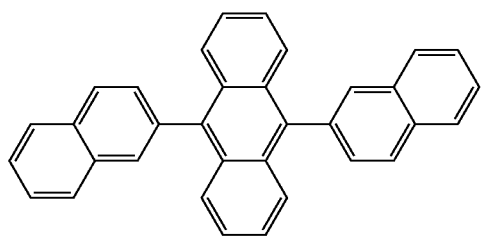

wherein, in Formulae 2 and 3, $R_1$ to $R_6$ are each independently a hydrogen atom, a deuterium atom, a halogen atom, a hydroxy group, a cyano group, a substituted or unsubstituted $C_1$-$C_{30}$ alkyl group, a substituted or unsubstituted $C_1$-$C_{30}$ alkoxy group, a substituted or unsubstituted $C_1$-$C_{30}$ acyl group, a substituted or unsubstituted $C_2$-$C_{30}$ alkenyl group, a substituted or unsubstituted $C_2$-$C_{30}$ alkynyl group, a substituted or unsubstituted $C_6$-$C_{30}$ aryl group, or a substituted or unsubstituted $C_2$-$C_{30}$ heteroaryl group, wherein at least two adjustment groups thereof are optionally linked together to form a saturated or unsaturated ring;

$L_1$ is a single bond, a substituted or unsubstituted $C_1$-$C_{30}$ alkylene group, a substituted or unsubstituted $C_6$-$C_{30}$ arylene group, or a substituted or unsubstituted $C_2$-$C_{30}$ hetero arylene group;

$Q_1$ to $Q_9$ are each independently a hydrogen atom, a substituted or unsubstituted $C_6$-$C_{30}$ aryl group, or a substituted or unsubstituted $C_2$-$C_{30}$ heteroaryl group; and a is an integer from 1 to 10.

7. The organic light-emitting device of claim 6, wherein $R_1$ to $R_6$ are each independently one of a hydrogen atom, a deuterium atom, a halogen atom, a hydroxy group, a cyano group, a $C_1$-$C_{20}$ alkyl group and a $C_1$-$C_{20}$ alkoxy group; and a phenyl group, a naphthyl group, an anthryl group, and a biphenyl group; and a phenyl group, a naphthyl group, and an anthryl group that are substituted with one of a deuterium atom, a halogen atom, a hydroxy group, a cyano group, a $C_1$-$C_{20}$ alkyl group, a $C_1$-$C_{20}$ alkoxy group, a phenyl group, a naphthyl group, and an anthryl group.

8. The organic light-emitting device of claim 6, wherein $L_1$ is one of a single bond, a phenylene group, a naphthylene group, an anthrylene group, a pyridinylene group, and a pyrimidinylene group; and a phenylene group, a naphthylene group, an anthrylene group, a pyridinylene group, and a pyrimidinylene group that are substituted with at least one of a deuterium atom, a halogen atom, a hydroxy group, a cyano group, a $C_1$-$C_{20}$ alkyl group, a $C_1$-$C_{20}$ alkoxy group, a phenyl group, a naphthyl group, and an anthryl group.

9. The organic light-emitting device of claim 1, wherein the anthracene-based compound comprises one of Compounds 101, 102, and 103 below:

<Compound 101>

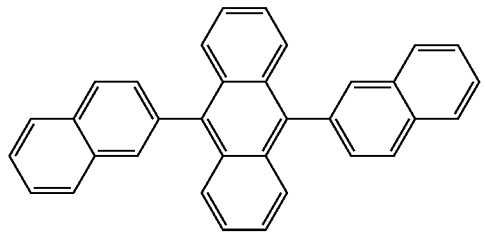

-continued

<Compound 102>

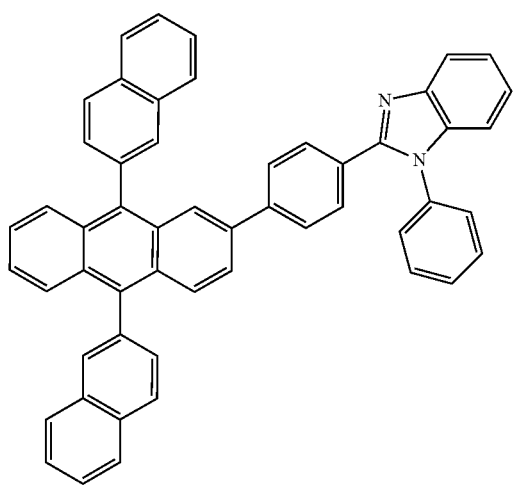

<Compound 103>

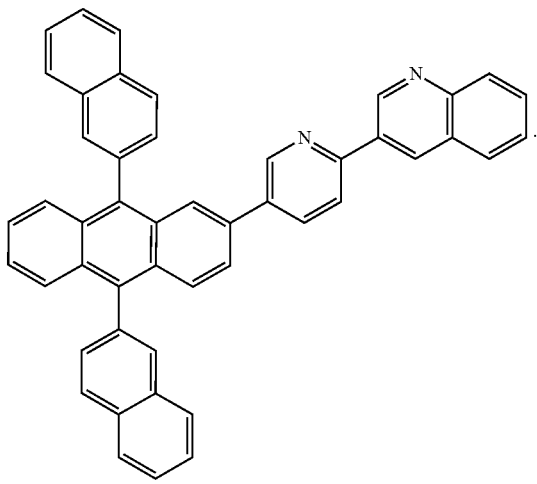

10. The organic light-emitting device of claim 1, wherein the carbazole-based compound comprises one of Compounds 309 to 320 below:

309

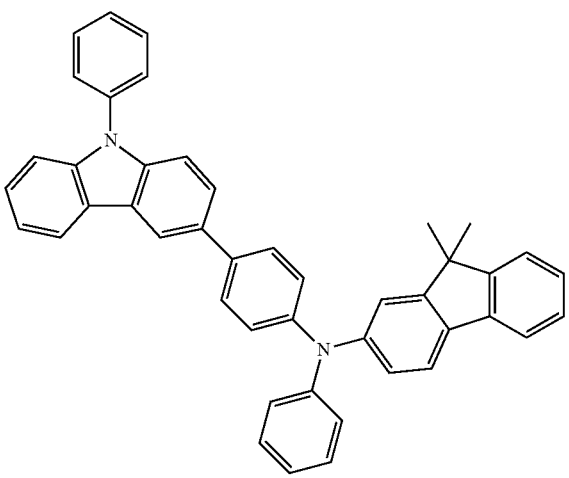

310
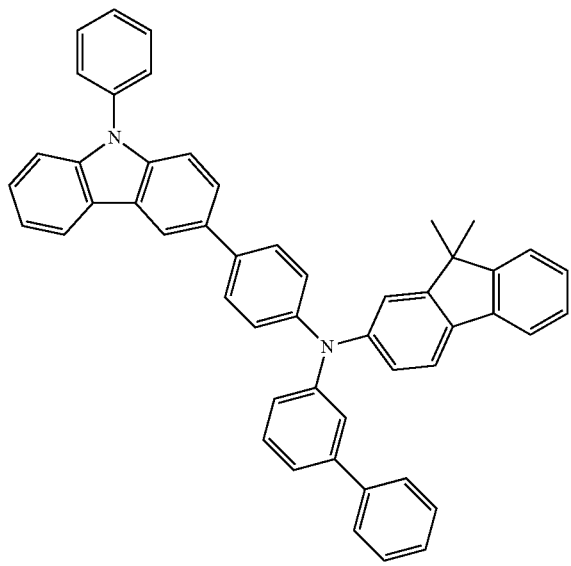
311
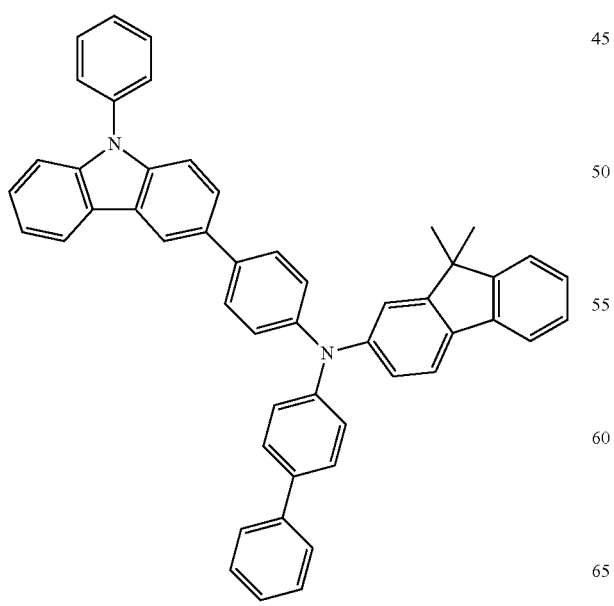
312
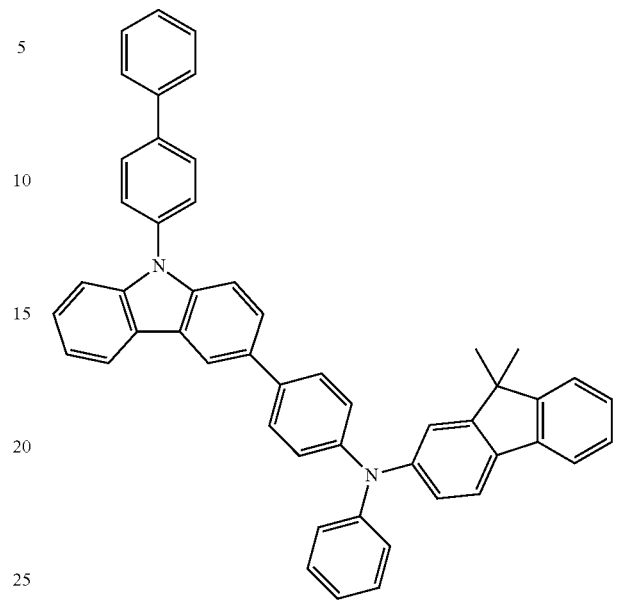
313
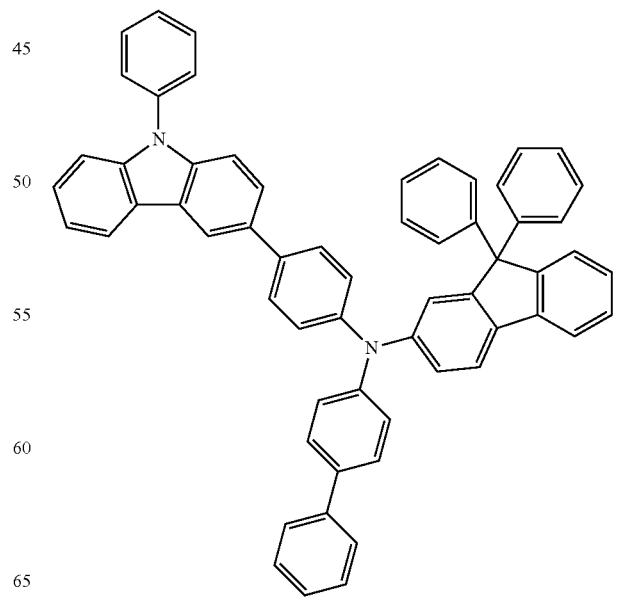

314
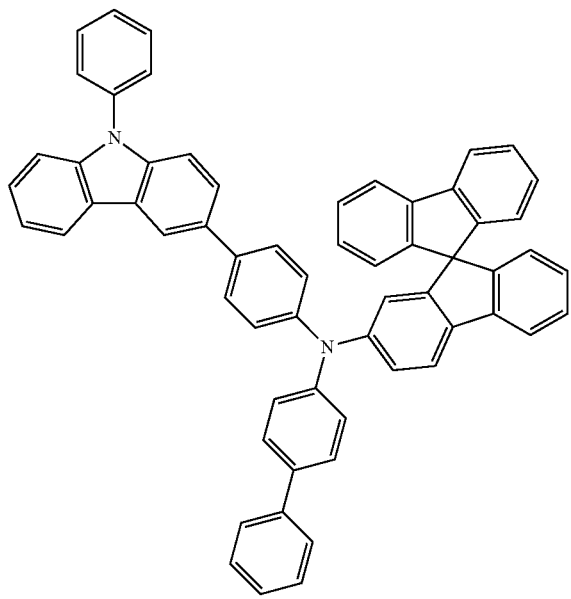
315
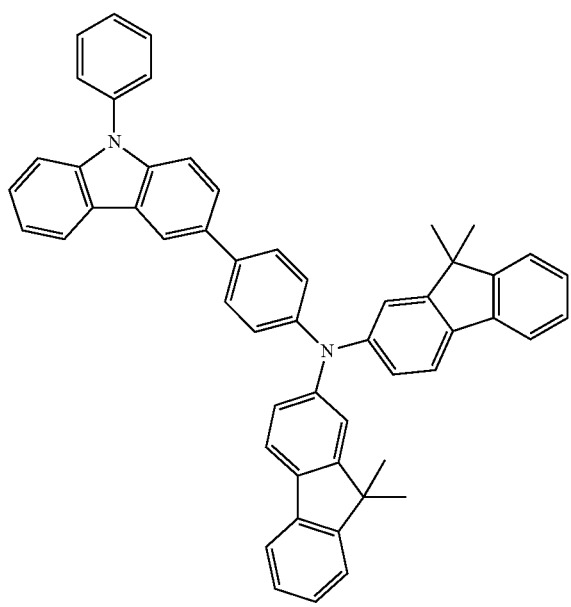
316
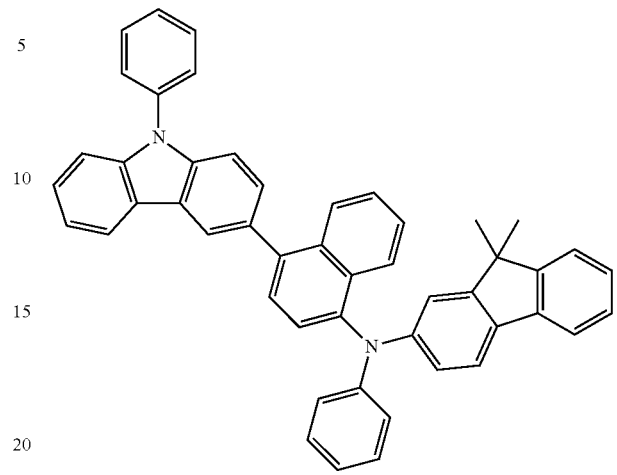
317
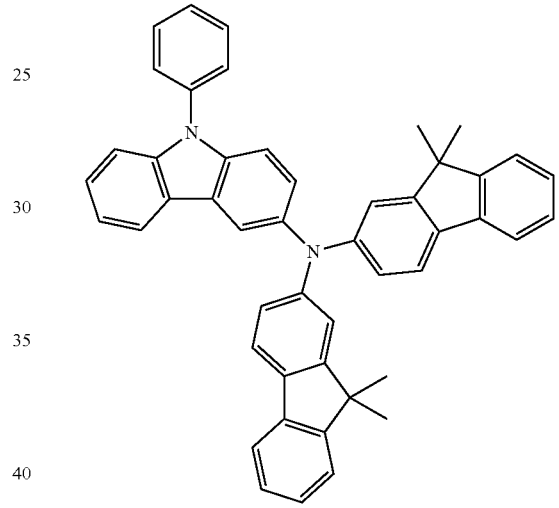
318
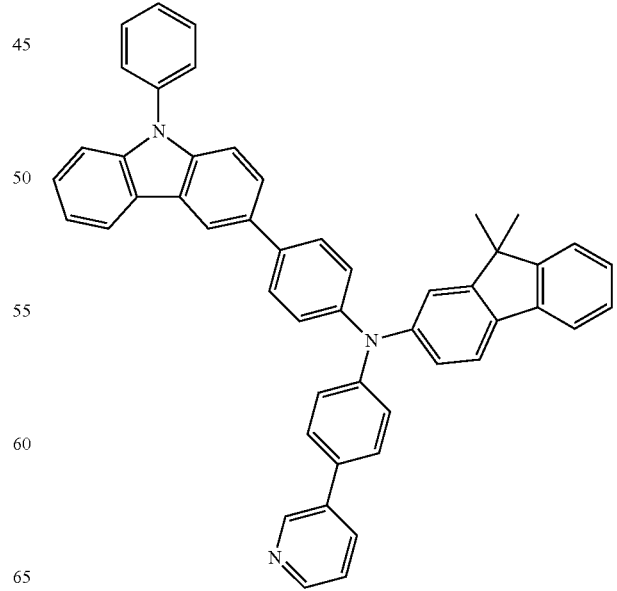

-continued

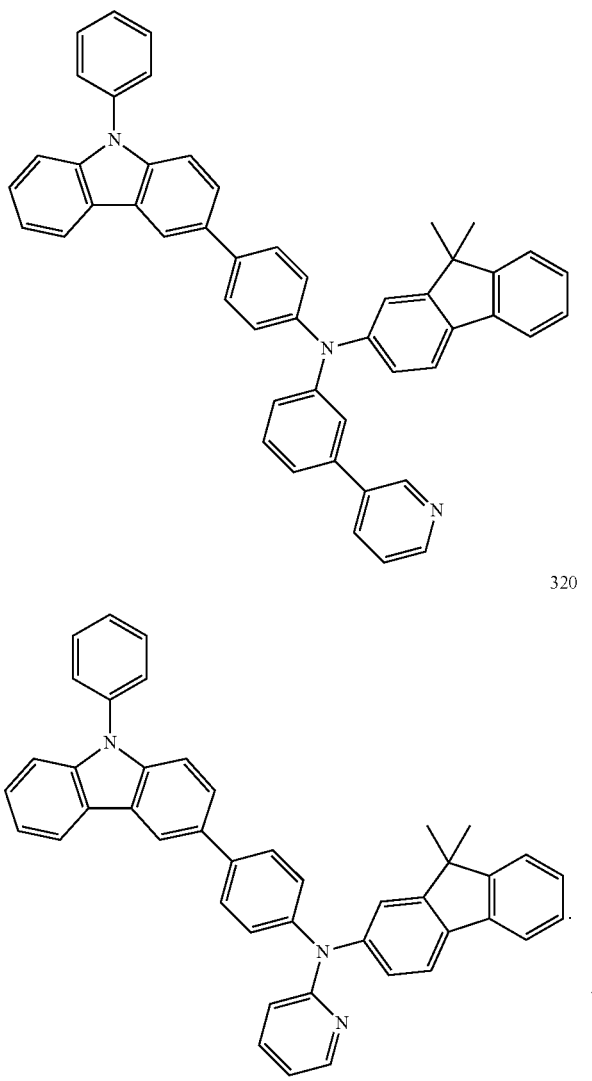

319

320

11. The organic light-emitting device of claim 1, wherein the anthracene-based compound and the carbazole-based compound are in a weight ratio of about 70:30 to 95:5.

12. The organic light-emitting device of claim 1, further comprising at least one of a hole injection layer, a hole transport layer, and a functional layer having both hole injecting and hole transporting capabilities between the first electrode and the organic emission layer.

13. The organic light-emitting device of claim 1, further comprising an electron injection layer between the second electrode and the electron transport layer.

14. The organic light-emitting device of claim 1, wherein the electron transport layer further comprises an electron-migration retarding material.

15. The organic light-emitting device of claim 1, wherein the electron-migration retarding material comprises at least one of an oxadiazole derivative, a triazole derivative, and a phenanthroline derivative.

16. The organic light-emitting device of claim 14, wherein the amount of the electron-migration retarding material is from about 5 wt % to about 30 wt % based on the total weight of the electron transport layer.

17. The organic light-emitting device of claim 14, wherein the anthracene-based compound comprises one of Compounds 101, 102, and 103 below, and the carbazole-based compound comprises one of Compounds 309 to 320 below:

<Compound 101>

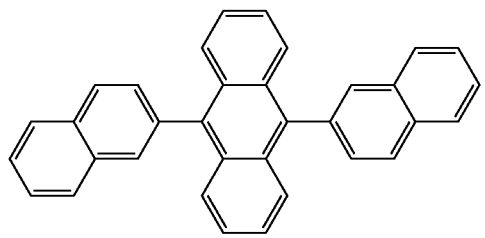

<Compound 102>

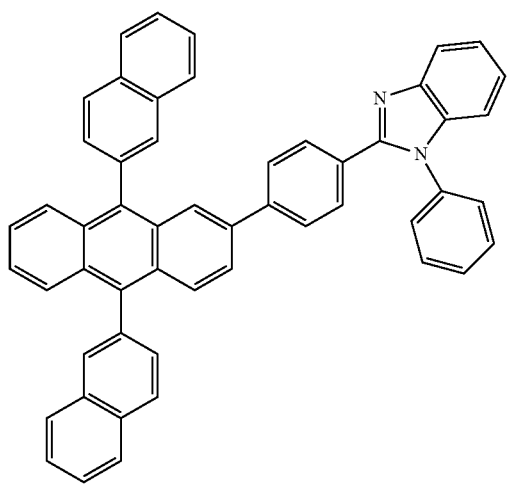

<Compound 103>

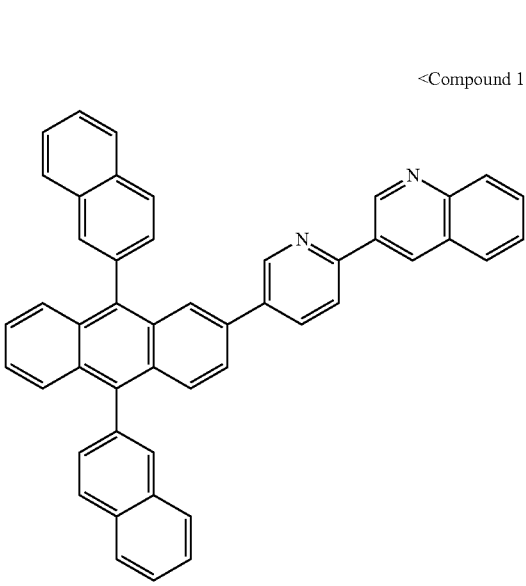

309
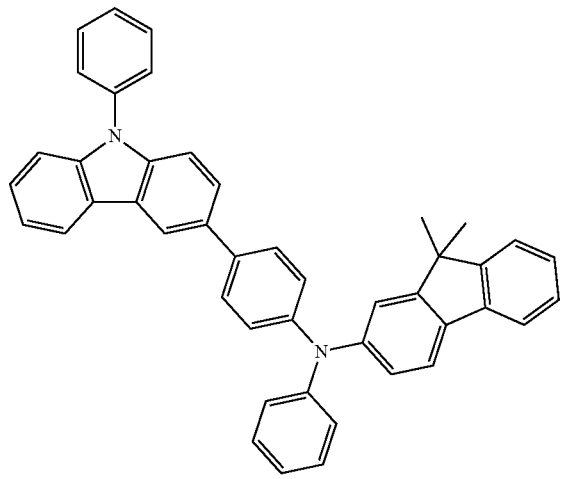
311
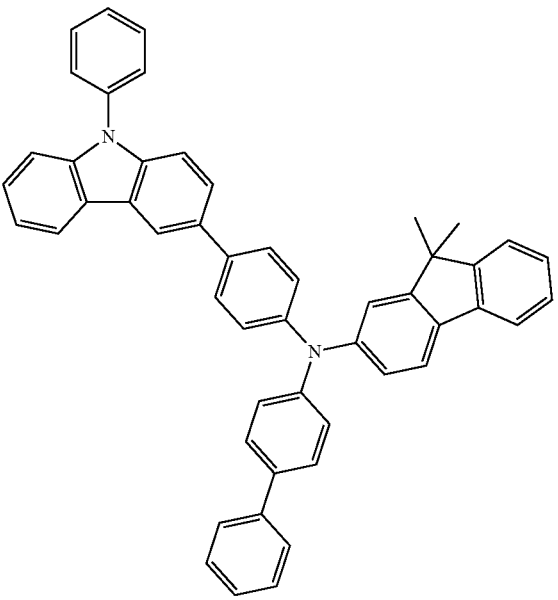
310
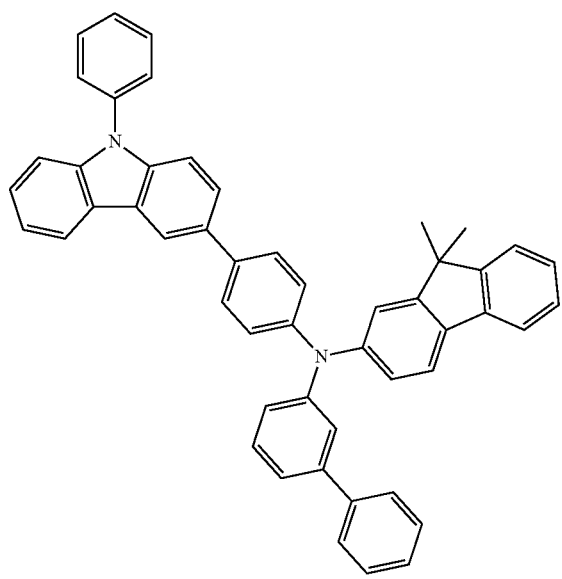
312
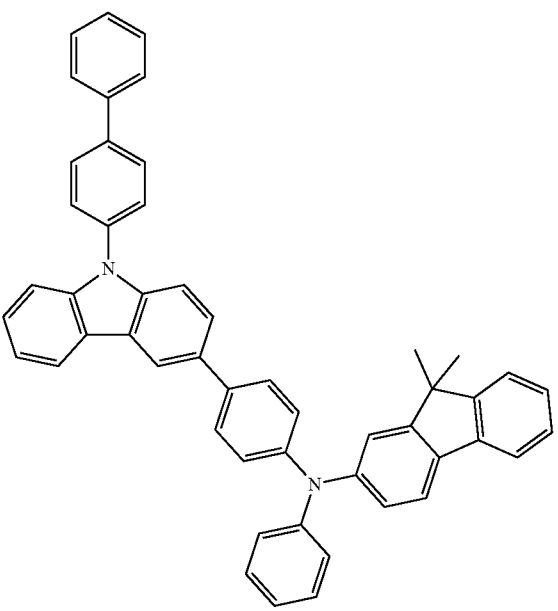

313
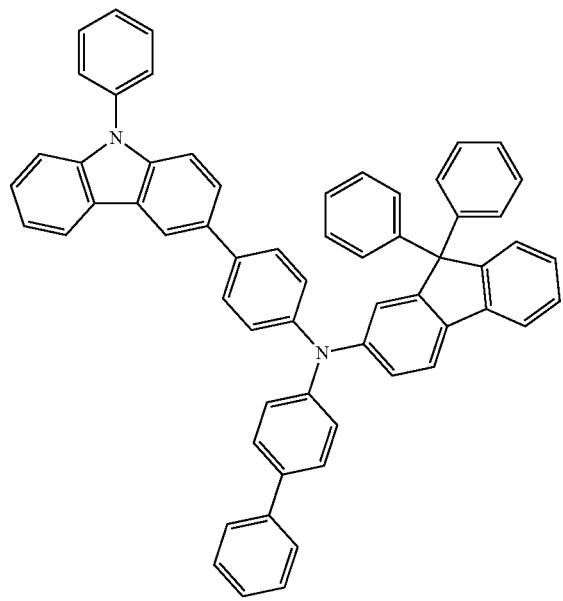
314
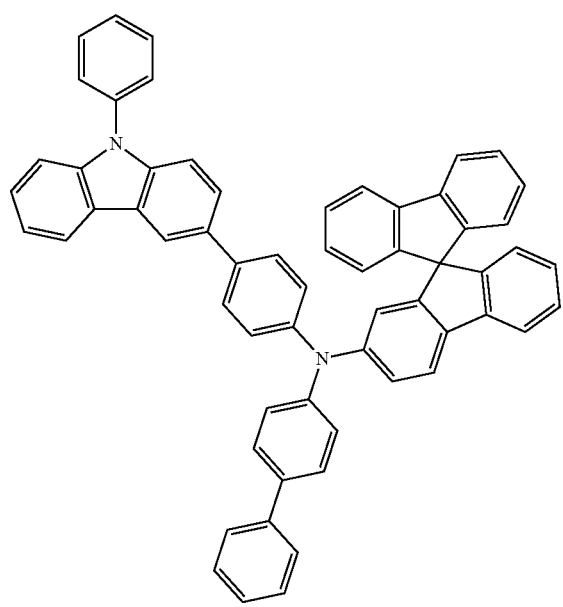
315
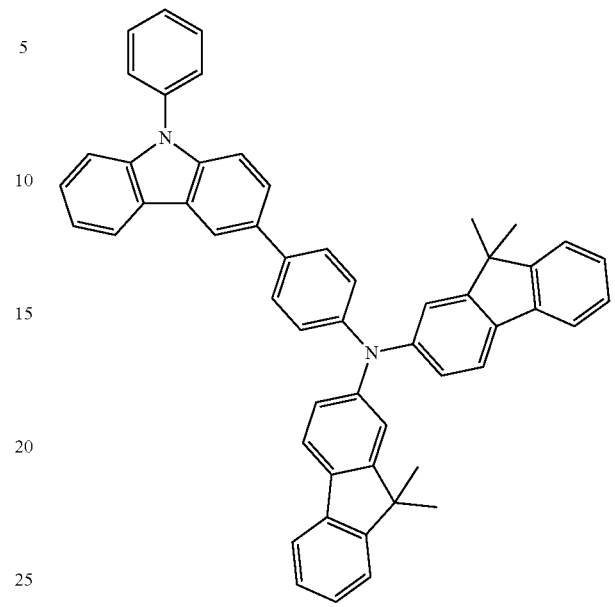
316
317

318

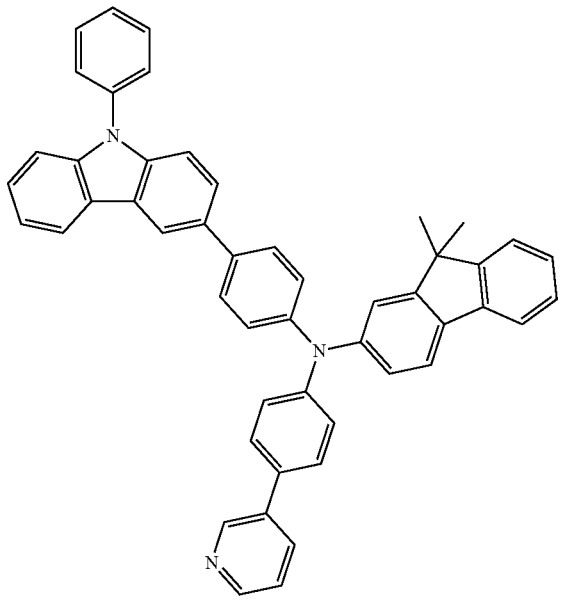

319

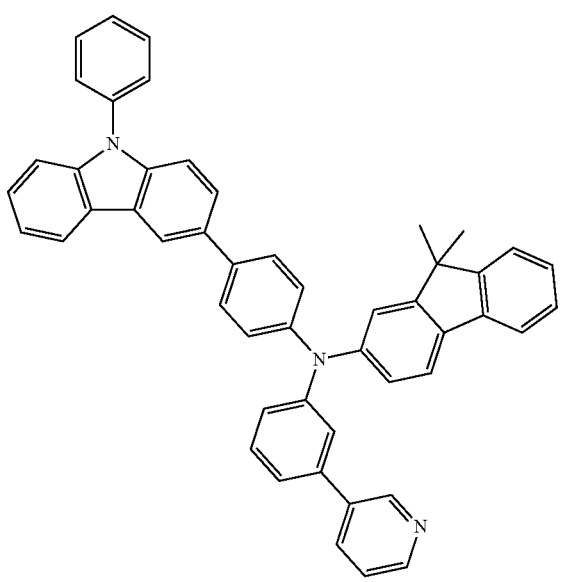

320

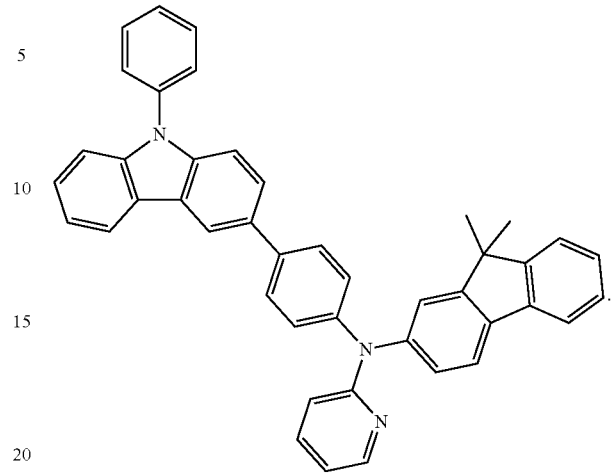

18. A method of manufacturing an organic light-emitting device, the method comprising:
  forming a first electrode on a substrate;
  forming an organic emission layer on the first electrode;
  forming an electron transport layer on the organic emission layer, the electron transport layer including an anthracene-based compound and a carbazole-based compound represented by Formula 1 below; and
  forming a second electrode on the electron transport layer:

<Formula 1>

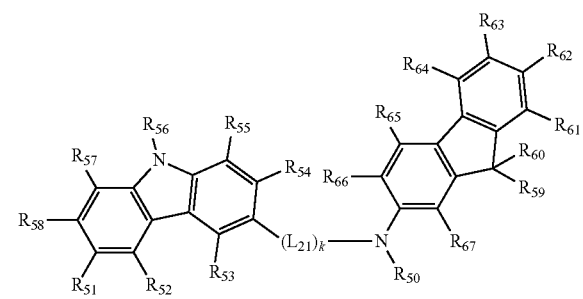

wherein $R_{50}$ is one of a substituted or unsubstituted phenyl group, a substituted or unsubstituted naphthyl group, a substituted or unsubstituted anthryl group, a substituted or unsubstituted biphenyl group, and a substituted or unsubstituted pyridinyl group;

$L_{21}$ is one of a substituted or unsubstituted $C_1$-$C_{30}$ alkylene group, a substituted or unsubstituted $C_2$-$C_{30}$ alkenylene group, a substituted or unsubstituted $C_6$-$C_{30}$ arylene group, and a substituted or unsubstituted $C_2$-$C_{30}$ hetero arylene group;

$R_{51}$ to $R_{67}$ are each independently one of a hydrogen atom, a deuterium atom, a halogen, a hydroxyl group, a cyano group, a nitro group, a carboxyl group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_1$-$C_{30}$ alkylthio group, a substituted or unsubstituted $C_3$-$C_{10}$ cycloalkyl group, a substituted or unsubstituted $C_3$-$C_{10}$ cycloalkenyl group, a substituted or unsubstituted $C_6$-$C_{30}$ aryl group, a substituted or unsubstituted $C_6$-$C_{30}$ aryloxy group, a substituted or unsubstituted $C_6$-$C_{30}$ arylthio group, a substituted or unsubstituted $C_2$-$C_{30}$ heteroaryl group, and —N($Q_{11}$)($Q_{12}$), where $Q_{11}$ and $Q_{12}$ are each independently one of a hydrogen atom, a deuterium atom, a halogen, a hydroxyl group, a cyano group, an amino group, a nitro group, a carboxyl group, a $C_1$-$C_{30}$ alkyl group, a $C_2$-$C_{30}$ alkenyl group, a $C_2$-$C_{30}$ alkynyl group, a $C_1$-$C_{30}$ alkoxy group, a $C_1$-$C_{30}$ alkylthio group, a $C_3$-$C_{10}$ cycloalkyl group, a $C_3$-$C_{10}$ cycloalkenyl group, a $C_6$-$C_{30}$ aryl group, a $C_6$-$C_{30}$ aryloxy group, a $C_6$-$C_{30}$ arylthio group, and a $C_2$-$C_{30}$ heteroaryl group; and k is an integer from 0 to 3.

19. The method of claim 18, wherein forming the electron transport layer is performed by co-depositing the anthracene-based compound and the carbazole-based compound.

20. The method of claim 18, wherein the electron transport layer further comprises an electron-migration retarding material, and the forming of the electron transport layer is performed by co-depositing the anthracene-based compound, the carbazole-based compound and the electro-migration retarding material.

* * * * *